United States Patent
Kitamura et al.

(10) Patent No.: US 8,520,766 B2
(45) Date of Patent: Aug. 27, 2013

(54) TRANSMITTER AND COMMUNICATION APPARATUS

(75) Inventors: Ryo Kitamura, Kanagawa (JP); Yukihiro Omoto, Nara (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/148,747

(22) PCT Filed: Oct. 12, 2010

(86) PCT No.: PCT/JP2010/006050
§ 371 (c)(1), (2), (4) Date: Aug. 10, 2011

(87) PCT Pub. No.: WO2011/077616
PCT Pub. Date: Jun. 30, 2011

(65) Prior Publication Data
US 2012/0250747 A1    Oct. 4, 2012

(30) Foreign Application Priority Data
Dec. 24, 2009 (JP) ................ 2009-293164

(51) Int. Cl.
*H04L 27/00* (2006.01)

(52) U.S. Cl.
USPC ........... 375/295; 375/296; 375/297; 375/300; 375/259; 375/260; 375/279; 375/284; 375/285; 375/286

(58) Field of Classification Search
USPC ............... 375/295, 296, 297, 300, 259, 260, 375/279, 284, 285, 268
See application file for complete search history.

(56) References Cited

U.S. PATENT DOCUMENTS

| | | |
|---|---|---|
| 2005/0153669 A1 | 7/2005 | Suzuki et al. |
| 2007/0159256 A1 | 7/2007 | Ishikawa et al. |
| 2008/0233904 A1 | 9/2008 | Suzuki et al. |
| 2008/0261543 A1 | 10/2008 | Hara et al. |
| 2009/0097591 A1* | 4/2009 | Kim .............................. 375/297 |
| 2009/0296855 A1* | 12/2009 | Kitamura et al. ............. 375/297 |

FOREIGN PATENT DOCUMENTS

| | | |
|---|---|---|
| JP | 2005-203960 | 7/2005 |
| JP | 2007-180795 | 7/2007 |
| JP | 2008-211449 | 9/2008 |
| JP | 2008-283678 | 11/2008 |
| JP | 2009-194575 | 8/2009 |

OTHER PUBLICATIONS

International Search Report issued Jan. 11, 2011 in corresponding International Application No. PCT/JP2010/006050.

* cited by examiner

*Primary Examiner* — Siu Lee
(74) *Attorney, Agent, or Firm* — Wenderoth, Lind & Ponack, L.L.P.

(57) ABSTRACT

Provided is a transmitter which is small in size and operates with high efficiency and compensates a delay error with high accuracy. A signal generation section 11 outputs a PM test signal and an AM test signal. The AM test signal is inputted to a multiplier 16 via a delay adjustment section 12 and a regulator 14. The PM test signal is inputted to the multiplier 16 via the delay adjustment section 12. A power measurement section 17 measures an average power of a multiplication signal which is outputted from the multiplier 16 and outputs a measured value to a control section 18. The control section 18 determines an amplitude delay time and a phase delay time on the basis of the inputted measured value and sets the determined delay times in the delay adjustment section 12.

17 Claims, 16 Drawing Sheets

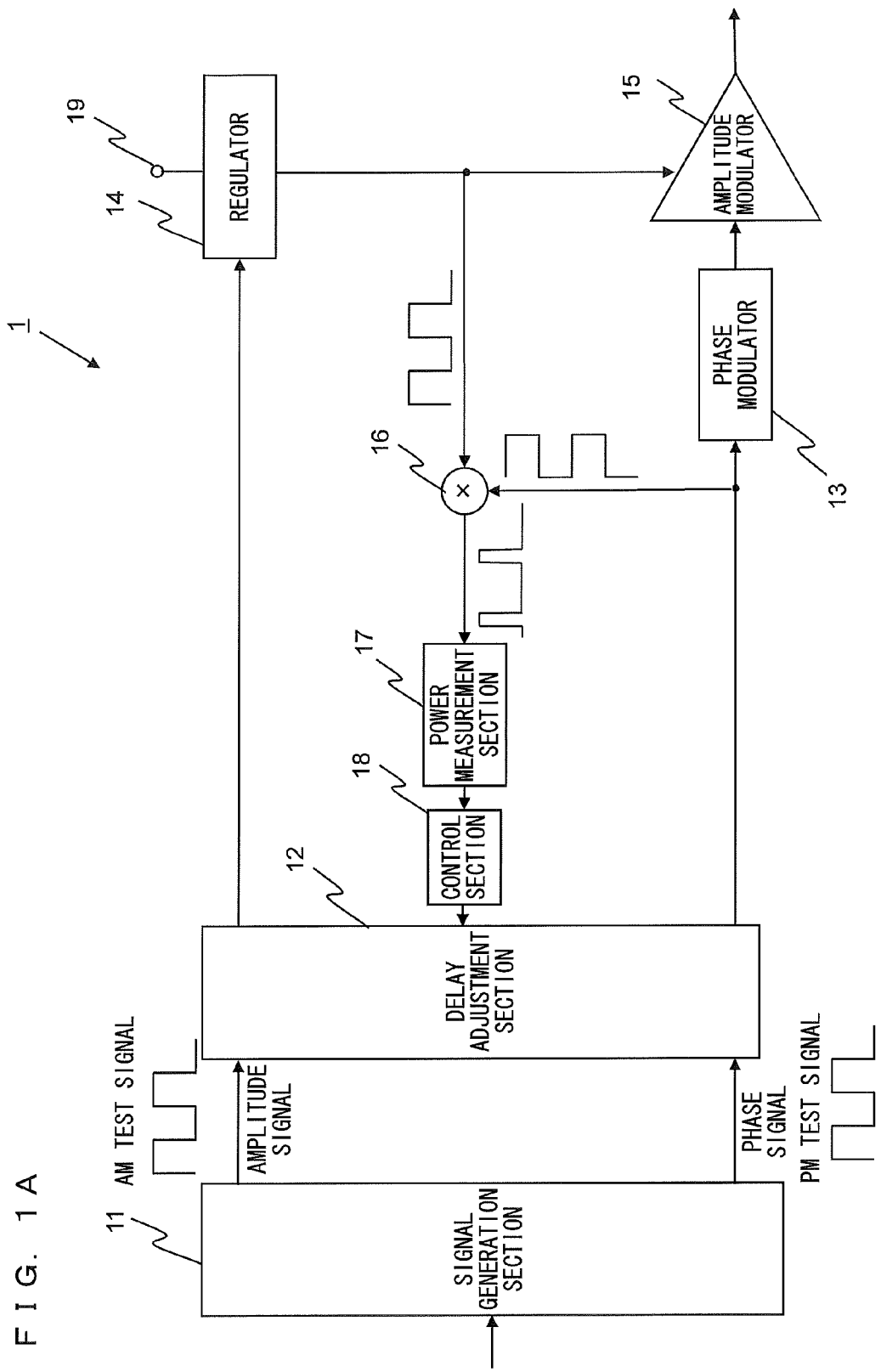

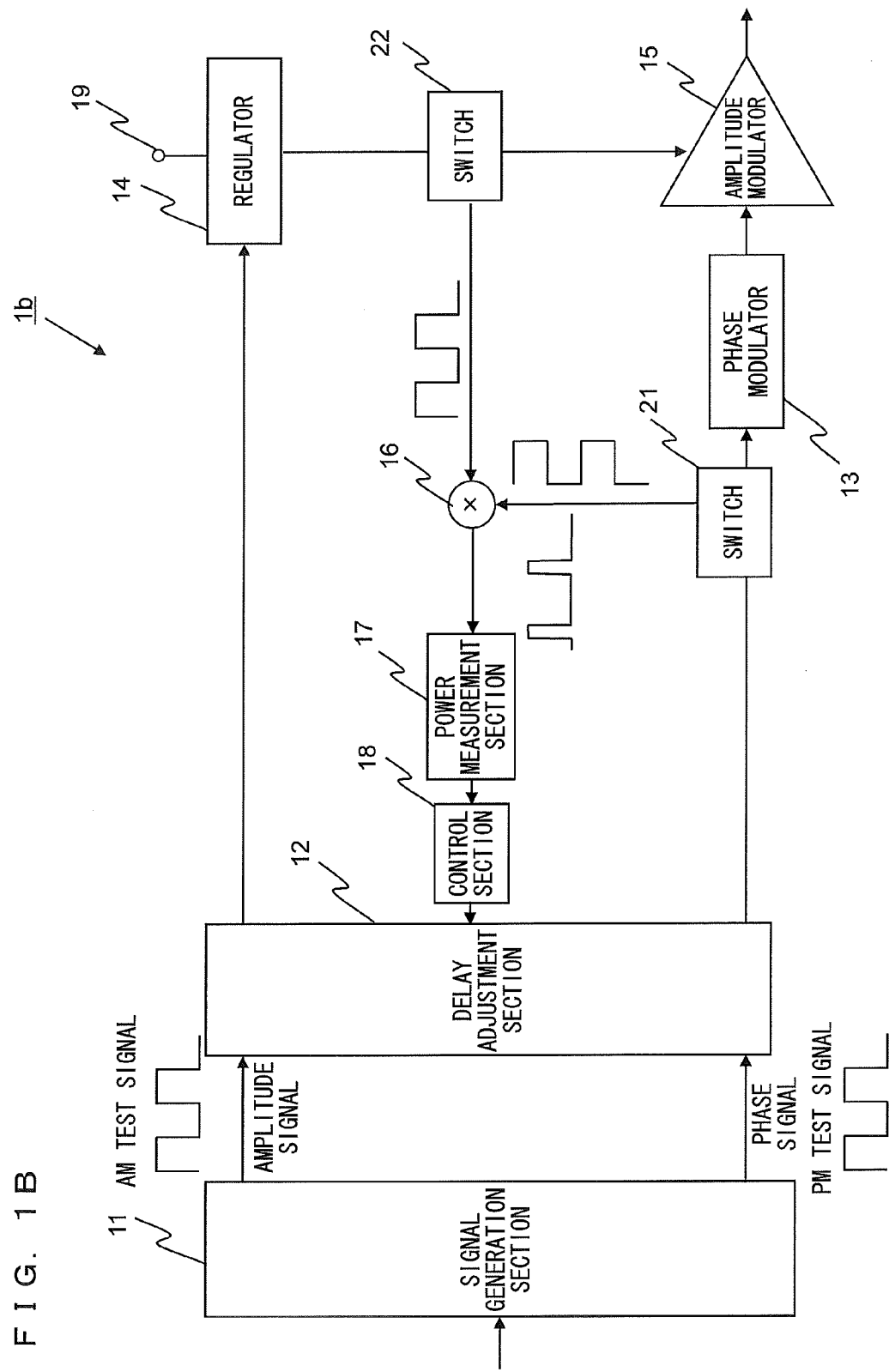

FIG. 6

| | | SINE WAVE | | | | | RECTANGULAR WAVE | | | | | TRIANGULAR WAVE | | | | | SAW-TOOTH WAVE | | | | | HALF WAVE | | | | |
|---|---|---|---|---|---|---|---|---|---|---|---|---|---|---|---|---|---|---|---|---|---|---|---|---|---|---|
| AM TEST SIGNAL | PM TEST SIGNAL | SINE WAVE | RECTANGULAR WAVE | TRIANGULAR WAVE | SAW-TOOTH WAVE | HALF WAVE | SINE WAVE | RECTANGULAR WAVE | TRIANGULAR WAVE | SAW-TOOTH WAVE | HALF WAVE | SINE WAVE | RECTANGULAR WAVE | TRIANGULAR WAVE | SAW-TOOTH WAVE | HALF WAVE | SINE WAVE | RECTANGULAR WAVE | TRIANGULAR WAVE | SAW-TOOTH WAVE | HALF WAVE | SINE WAVE | RECTANGULAR WAVE | TRIANGULAR WAVE | SAW-TOOTH WAVE | HALF WAVE |
| SAME CYCLE | CONTINUOUS TRANSMISSION | ○ | × | ○ | ○ | ○ | × | ○ | ○ | ○ | ○ | ○ | ○ | ○ | ○ | ○ | ○ | ○ | ○ | ○ | ○ | ○ | ○ | ○ | ○ | ○ |
| | 1CYCLE-ONLY TRANSMISSION | ○ | × | ○ | ○ | ○ | ○ | ○ | ○ | ○ | ○ | ○ | ○ | ○ | ○ | ○ | ○ | ○ | ○ | ○ | ○ | ○ | ○ | ○ | ○ | ○ |
| 1.5*AM CYCLE = PM CYCLE | CONTINUOUS TRANSMISSION | × | × | × | ○ | × | ○ | × | ○ | ○ | ○ | ○ | ○ | ○ | ○ | ○ | ○ | ○ | ○ | ○ | ○ | ○ | ○ | ○ | ○ | ○ |
| | 1CYCLE-ONLY TRANSMISSION | ○ | ○ | ○ | ○ | ○ | ○ | ○ | ○ | ○ | ○ | ○ | ○ | ○ | ○ | ○ | ○ | ○ | ○ | ○ | ○ | ○ | ○ | ○ | ○ | ○ |
| 2*AM CYCLE = PM CYCLE | CONTINUOUS TRANSMISSION | × | ○ | ○ | ○ | ○ | × | × | ○ | ○ | × | ○ | ○ | ○ | ○ | ○ | ○ | ○ | ○ | ○ | ○ | ○ | × | ○ | ○ | ○ |
| | 1CYCLE-ONLY TRANSMISSION | × | ○ | × | ○ | ○ | ○ | × | ○ | ○ | × | ○ | ○ | ○ | ○ | ○ | ○ | ○ | ○ | ○ | ○ | ○ | × | ○ | ○ | ○ |
| 3*AM CYCLE = PM CYCLE | CONTINUOUS TRANSMISSION | × | ○ | ○ | ○ | ○ | × | ○ | ○ | ○ | × | ○ | ○ | ○ | ○ | ○ | ○ | ○ | ○ | ○ | ○ | ○ | × | ○ | ○ | ○ |
| | 1CYCLE-ONLY TRANSMISSION | ○ | ○ | ○ | ○ | ○ | × | × | ○ | × | ○ | × | ○ | ○ | ○ | ○ | ○ | ○ | ○ | ○ | ○ | ○ | ○ | ○ | ○ | ○ |
| AM CYCLE= 1.5*PM CYCLE | CONTINUOUS TRANSMISSION | × | × | ○ | ○ | × | ○ | × | ○ | ○ | × | ○ | × | ○ | ○ | ○ | ○ | ○ | ○ | ○ | ○ | ○ | ○ | ○ | ○ | ○ |
| | 1CYCLE-ONLY TRANSMISSION | ○ | ○ | ○ | ○ | × | ○ | ○ | ○ | ○ | ○ | ○ | ○ | ○ | ○ | ○ | ○ | ○ | ○ | ○ | ○ | ○ | × | ○ | ○ | ○ |
| AM CYCLE= 2*PM CYCLE | CONTINUOUS TRANSMISSION | × | × | ○ | ○ | × | ○ | × | ○ | ○ | ○ | ○ | × | ○ | ○ | ○ | ○ | ○ | ○ | ○ | ○ | ○ | × | ○ | ○ | ○ |
| AM CYCLE= 3*PM CYCLE | CONTINUOUS TRANSMISSION | × | ○ | ○ | ○ | × | × | ○ | ○ | ○ | × | × | ○ | × | ○ | ○ | ○ | ○ | ○ | ○ | ○ | ○ | ○ | ○ | ○ | ○ |
| | 1CYCLE-ONLY TRANSMISSION | ○ | × | ○ | ○ | ○ | ○ | × | × | ○ | ○ | ○ | × | ○ | ○ | ○ | × | ○ | ○ | ○ | ○ | × | ○ | ○ | ○ | ○ |

F I G. 7
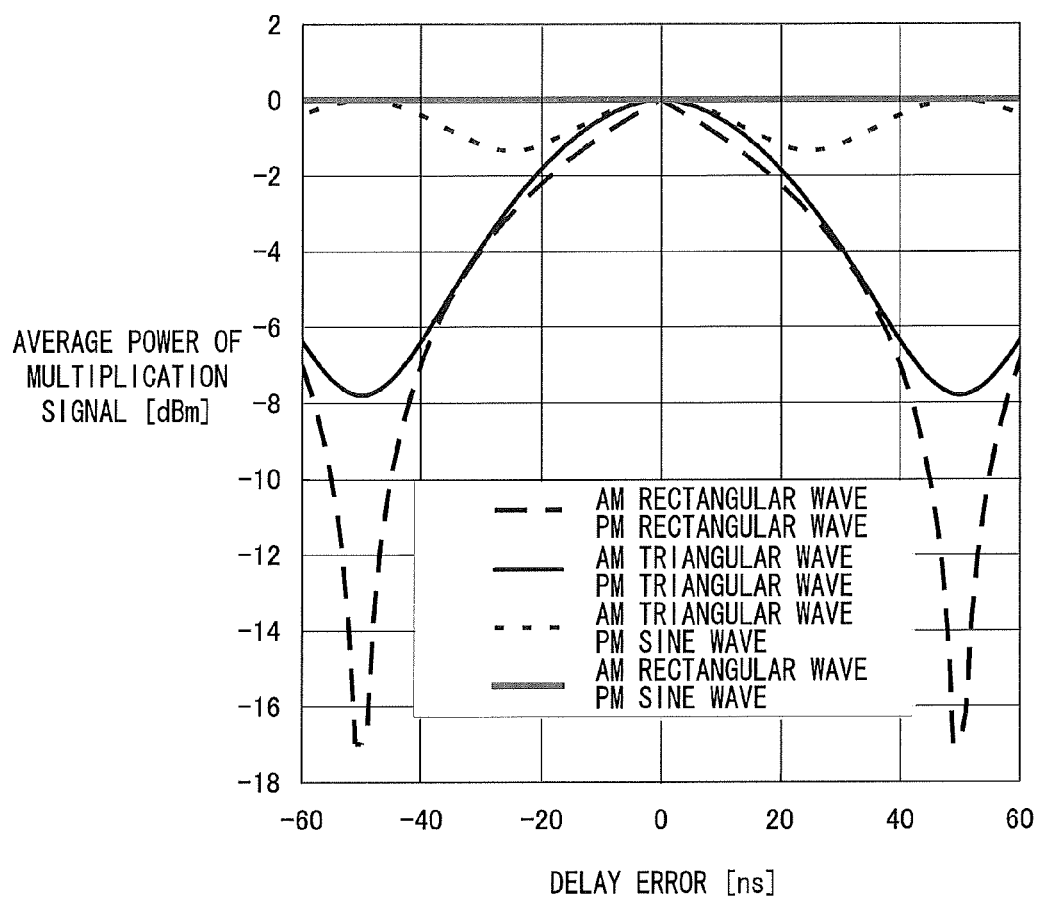

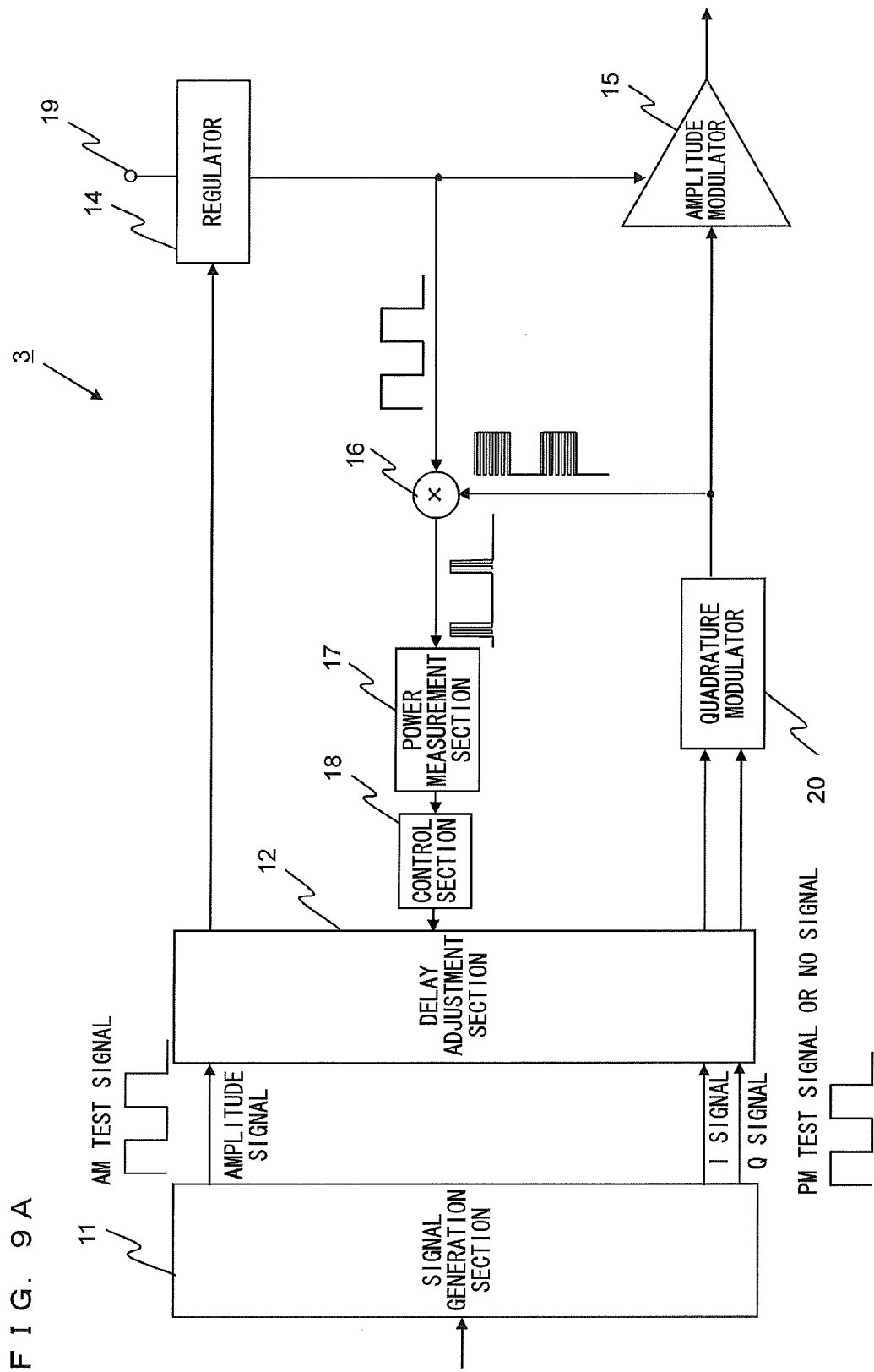

F I G. 1 0
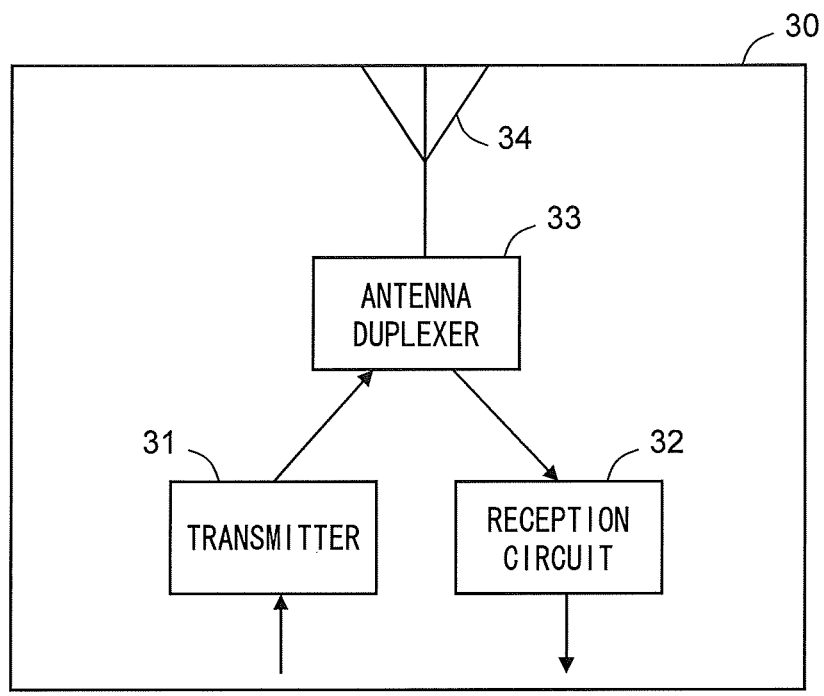

TRANSMITTER AND COMMUNICATION APPARATUS

TECHNICAL FIELD

The present invention relates to a transmitter used for a communication apparatus such as a mobile phone, a wireless LAN, and the like. The present invention more particularly relates to a transmitter which is small in size, operates highly efficiently, and compensates a delay error highly accurately.

BACKGROUND ART

In a recent highly information-oriented society, a communication apparatus such as a mobile phone, a wireless LAN, and the like is required to ensure linearity of a transmission signal over a broad power amplification range while operating with low power consumption. In such a communication apparatus, a transmitter which outputs a highly accurate transmission signal regardless of a bandwidth while operating with high efficiency is adopted. In the following, a conventional transmitter will be described.

As a conventional transmitter, for example, there has been a transmitter (hereinafter referred to as a quadrature modulation circuit) which generates a transmission signal by using a modulation method such as a quadrature modulation, and the like. Here, as being widely known, description of the quadrature modulation circuit is omitted. Further, as a conventional transmitter which operates with higher accuracy and higher efficiency than the quadrature modulation circuit, for example, there has been a transmitter 50 shown in FIG. 11.

FIG. 11 is a block diagram showing an example of a configuration of the conventional transmitter 50. In FIG. 10, the conventional transmitter 50 includes a signal generation section 501, a phase modulator 502, a regulator 503, a power amplifier 504, and a power supply terminal 505. The power amplifier 504 includes a transistor for amplification.

In the conventional transmitter 50, the signal generation section 501 generates an amplitude signal and a phase signal. The amplitude signal is inputted to the regulator 503. Further, a direct current voltage is supplied to the regulator 503 from the power supply terminal 505. The regulator 503 supplies, to the power amplifier 504, a voltage in accordance with the inputted amplitude signal. Typically, the regulator 503 supplies the power amplifier 504 with a voltage which is proportional to a magnitude of the inputted amplitude signal.

Meanwhile, the phase signal is inputted to the phase modulator 502. The phase modulator 502 phase-modulates the phase signal to a phase modulated signal and outputs the phase modulated signal. The phase modulated signal is inputted to the power amplifier 504. The power amplifier 504 amplitude-modulates the phase modulated signal to a modulated signal by the voltage supplied from the regulator 503 and outputs the modulated signal which has been phase-modulated and amplitude-modulated. The modulated signal is outputted as a transmission signal from an output terminal. It should be noted that the transmitter 50 described above is referred to as a polar modulation circuit.

In the conventional transmitter 50, the amplitude signal and the phase signal generated by the signal generation section 501 are signal-processed in two paths (a phase modulator 502 and the regulator 503) separately and amplitude-modulated concurrently by the power amplifier 504. Thus, in the power amplifier 504, a difference (that is, a delay error) may occur between a delay time generated in the path of the amplitude signal and a delay time generated in the path of the phase signal. Hereinafter, the delay time generated in the path of the amplitude signal is simply referred to as a delay time of the amplitude signal while the delay time generated in the path of the phase signal is simply referred to as a delay time of the phase signal. The difference between the delay times described above deteriorates distortion of the transmission signal.

Patent Literature 1 discloses a transmitter which compensates a difference between a delay time of a phase signal and a delay time of an amplitude signal in the polar modulation method. FIG. 12 is a block diagram showing a configuration of a conventional transmitter 51 disclosed in Patent Literature 1. In FIG. 12, the conventional transmitter 51 includes an input terminal 511, a signal input section 512, a coupler 513, a limiter 514, a phase shifter 515, a radio-frequency amplifier 516, an envelope detection section 517, an amplitude modulator 518, a coupler 519, an output terminal 520, a phase difference calculation section 521, and a phase shift control section 522.

An input signal from the signal input section 512 is inputted via the coupler 513 to each of the limiter 514 and the envelope detection section 517. The limiter 514 extracts a phase signal from the input signal. The phase signal is inputted via the phase shifter 515 to the radio-frequency amplifier 516. The envelope detection section 517 extracts an amplitude signal from the input signal. The amplitude signal is modulated to a predetermined magnitude by the amplitude modulator 518 and then inputted to the radio-frequency amplifier 516. By amplitude-modulating the phase signal in accordance with the amplitude signal, the radio-frequency amplifier 516 obtains an output signal.

Further, the signal input section 512 generates and outputs test signals Sin1, Sin2 in order to compensate the delay error. To the phase difference calculation section 521, the test signals Sin1, Sin2 are inputted via the coupler 513 while output signals Sout1, Sout2 from the radio-frequency amplifier 516 are inputted via the coupler 519. The phase difference calculation section 521 calculates a phase difference between the test signal Sin1 and the output signal Sout1, and obtains information of the phase difference between the Sin1 and the Sout1. Further, the phase difference calculation section 521 calculates a phase difference between the test signal Sin2 and the output signal Sout2 and obtains information of the phase difference between the Sin2 and the Sout2.

The phase difference calculation section 521 calculates a difference between a delay time of the amplitude signal and a delay time of the phase signal on the basis of the information of the phase difference between the Sin1 and the Sout1 and the information of the phase difference between the Sin2 and the Sout2. By adjusting a phase shift amount of the phase shifter 515 on the basis of the difference, which has been calculated by the phase difference calculation section 521, between the delay time of the amplitude signal and the delay time of the phase signal, the phase shift control section 522 adjusts the difference between the delay time of the amplitude signal and the delay time of the phase signal.

Citation List

[Patent Literature]

[Patent Literature 1] Japanese Laid-Open Patent Publication No. 2008-211449

SUMMARY OF THE INVENTION

Problems to be Solved by the Invention

However, in the conventional transmitter 51, there is a problem that the coupler 519 needs to be provided at an output side of the radio-frequency amplifier 516 so as to feedback the output signals Sout1, Sout2 to the phase difference calculation section 521, resulting in an increased circuit scale.

In addition, in the conventional transmitter 51, a radiation power from an antenna (not shown) when the test signal is outputted is limited, and thus a measure may has to be taken for suppressing the radiation power from the antenna. Specifically, in the conventional transmitter 51, a measure may be taken for, by providing an attenuator which can be switched ON/OFF between the radio-frequency amplifier 516 and the antenna and switching the attenuator ON when the test signal is outputted, attenuating the output signal from the radio-frequency amplifier 516 such that the radiation power from the antenna becomes lower than or equal to an allowable value. However, the provision of the attenuator causes a problem that the circuit scale of the transmitter 51 increases.

Furthermore, in the conventional transmitter 51, a delay error is estimated by detecting a phase difference of a radio frequency signal which is an output signal of the radio-frequency amplifier 516; however, the phase-difference-detection accuracy of the radio frequency signal is low in general, and thus the accuracy of the delay error estimation can also be low.

Therefore, in order to solve the above conventional problems, an objective of the present invention is to provide a transmitter which is small in size and which operates highly efficiently and compensates a delay error highly accurately, and a communication apparatus using the transmitter.

Solution to the Problems

The present invention is directed to a transmitter which outputs a transmission signal on the basis of an input signal. In order to achieve the above objective, the transmitter according to the present invention includes: a signal generation section for outputting an amplitude component of the input signal as an amplitude signal and outputting a phase component of the input signal as a phase signal in a normal transmission mode; a delay adjustment section for, on the basis of at least one of an amplitude delay time which is set to adjust a delay time of the amplitude signal and a phase delay time which is set to adjust a delay time of the phase signal, adjusting at least one of the delay time of the amplitude signal and the delay time of the phase signal; a phase modulator for phase-modulating the phase signal which is inputted via the delay adjustment section to a phase modulated signal and outputting the phase modulated signal; a regulator for outputting a signal in accordance with a magnitude of the amplitude signal which is inputted via the delay adjustment section; an amplitude modulator for, by amplifying the phase modulated signal outputted from the phase modulator in accordance with the signal outputted from the regulator, amplitude-modulating the phase modulated signal to a modulated signal and outputting the modulated signal which has been phase-modulated and amplitude-modulated; a multiplier for multiplying the phase signal outputted from the signal generation section by the signal outputted from the regulator and outputting a multiplication signal; a power measurement section for measuring a power of the multiplication signal; and a control section for calculating at least one of the amplitude delay time and the phase delay time on the basis of a value measured by the power measurement section. The signal generation section outputs a predetermined AM test signal as the amplitude signal and outputting a predetermined PM test signal as the phase signal in a test mode. The AM test signal and the PM test signal are set such that an average power of the multiplication signal becomes a maximum value when there is no delay error between the AM test signal and the PM test signal, and the average power of the multiplication signal shows a convex shape with the maximum value at the peak thereof with respect to a delay error within a predetermined time range. The control section estimates a delay error between the AM test signal and the PM test signal on the basis of the value measured by the power measurement section, calculates at least one of the amplitude delay time and the phase delay time so as to cancel the delay error, and sets the calculated delay time in the delay adjustment section.

Alternatively, the transmitter according to the present invention may have the following configuration. The transmitter includes: a signal generation section for outputting an amplitude component of the input signal as an amplitude signal and outputting a phase component of the input signal as an I signal and a Q signal in a normal transmission mode; a delay adjustment section for, on the basis of at least one of an amplitude delay time which is set to adjust a delay time of the amplitude signal and an IQ signal delay time which is set to adjust a delay time of the I signal and of the Q signal, adjusting at least one of the delay time of the amplitude signal and the delay time of the I signal and of the Q signal; a quadrature modulator for quadrature-modulating each of the I signal and the Q signal which are inputted via the delay adjustment section to a phase modulated signal and outputting the phase modulated signal; a regulator for outputting a signal in accordance with a magnitude of the amplitude signal which is inputted via the delay adjustment section; an amplitude modulator for, by amplifying the phase modulated signal outputted from the quadrature modulator in accordance with the signal outputted from the regulator, amplitude-modulating the phase modulated signal to a modulated signal and outputting the modulated signal which has been phase-modulated and amplitude-modulated; a multiplier, which is connected between the delay adjustment section and the quadrature modulator, for multiplying one of the I signal and the Q signal inputted via the delay adjustment section by the signal outputted from the regulator, and outputting a multiplication signal; a power measurement section for measuring a power of the multiplication signal; and a control section for calculating at least one of the amplitude delay time and the IQ signal delay time on the basis of a value measured by the power measurement section. The signal generation section outputs a predetermined AM test signal as the amplitude signal and outputs a predetermined PM test signal as one of the I signal and the Q signal, in a test mode. The AM test signal and the PM test signal are set such that an average power of the multiplication signal becomes a maximum value when there is no delay error between the AM test signal and the PM test signal, and the average power of the multiplication signal shows a convex shape with the maximum value at the peak thereof with respect to a delay error within a predetermined time range. The control section estimates a delay error between the AM test signal and the PM test signal on the basis of the value measured by the power measurement section, calculates at least one of the amplitude delay time and the IQ signal delay time so as to cancel the delay error, and sets the calculated delay time in the delay adjustment section.

Further, in the transmitter, the multiplier may be connected, instead of between the delay adjustment section and the quadrature modulator, between the quadrature modulator and the amplitude modulator, multiply the phase modulated signal outputted from the quadrature modulator by the signal outputted from the regulator, and output the multiplication signal.

Preferably, the predetermined time range is greater than a maximum variable range of the delay error which changes depending on characteristics variation of the transmitter.

Preferably, the amplitude modulator is stopped from operating in the test mode. Further, none of the amplitude delay time, the phase delay time, and the IQ signal delay time which are set in the delay adjustment section is changed in the normal transmission mode.

Preferably, the AM test signal and the PM test signal are outputted from the signal generation section continuously during a predetermined time period. Further, the predetermined time period is within 50 nsec. The AM test signal and the PM test signal are periodic functions.

Preferably, the AM test signal is any one of a sine wave, a rectangular wave, a triangular wave, a saw-tooth wave, and a half sine wave. The PM test signal is any one of a sine wave, a rectangular wave, a triangular wave, a saw-tooth wave, and a half sine wave.

Preferably, the transmitter further includes: a first switch for switching connection of the delay adjustment section between the phase modulator and the multiplier; and a second switch for switching connection of the regulator between the amplitude modulator the multiplier. The first switch connects the delay adjustment section to the phase modulator in the normal transmission mode and connects the delay adjusting section to the multiplier in the test mode. The second switch connects the regulator to the amplitude modulator in the normal transmission mode and connects the regulator to the multiplier in the test mode.

Alternatively, the transmitter may further include: a first switch for switching connection of the delay adjustment section between the quadrature modulator and the multiplier; and a second switch for switching connection of the regulator between the amplitude modulator and the multiplier. The first switch connects the delay adjustment section to the quadrature modulator in the normal transmission mode and connects the delay adjusting section to the multiplier in the test mode. The second switch connects the regulator to the amplitude modulator in the normal transmission mode and connects the regulator to the multiplier in the test mode.

The transmitter may further include: a first switch for switching connection of the quadrature modulator between the amplitude modulator and the multiplier; and a second switch for switching connection of the regulator between the amplitude modulator and the multiplier. The first switch connects the quadrature modulator to the amplitude modulator in the normal transmission mode and connects the quadrature modulator to the multiplier in the test mode. The second switch connects the regulator to the amplitude modulator in the normal transmission mode and connects the regulator to the multiplier in the test mode.

Furthermore, the present invention is directed also to a communication apparatus which includes the above described transmitter. The communication apparatus includes a transmitter for generating a transmission signal and an antenna for outputting the transmission signal generated in the transmitter. The communication apparatus may further include: a reception circuit for processing a reception signal which is received from the antenna; and an antenna duplexer for outputting the transmission signal generated in the transmitter to the antenna and outputting the reception signal received from the antenna to the reception circuit.

Advantageous Effects of the Invention

As described above, the transmitter according to the present invention can, by using a modulation method such as the quadrature modulation, and the like, operate with higher efficiency than the conventional transmitter which generates a transmission signal. Further, the transmitter can, by compensating the difference between the delay time of the amplitude signal and the delay time of the phase signal, improve distortion characteristics of the transmission signal. In addition, an element such as a coupler or the like which is required for compensating a delay in the conventional transmitter is not required, thereby realizing a circuit scale which is small in size. Further, delay compensation with higher accuracy than the delay compensation using the phase difference detection of the radio frequency signal can be realized.

BRIEF DESCRIPTION OF THE DRAWINGS

FIG. 1A is a block diagram showing an example of a configuration of a transmitter 1 according to a first embodiment of the present invention.

FIG. 1B is a block diagram showing an example of a configuration of a transmitter 1b according to the first embodiment of the present invention.

FIG. 6 illustrates whether or not the effect of the present invention can be achieved depending on combinations of the AM test signal and the PM test signal.

FIG. 7 shows an example of average power characteristics of a multiplication signal of the AM test signal and the PM test signal with respect to a delay error.

FIG. 9A is a block diagram showing an example of a configuration of a transmitter 3 according to a third embodiment of the present invention.

FIG. 10 is a block diagram showing an example of a configuration of a communication apparatus 30 according to a fourth embodiment of the present invention.

DESCRIPTION OF EMBODIMENTS (First Embodiment)

Figure 2A:
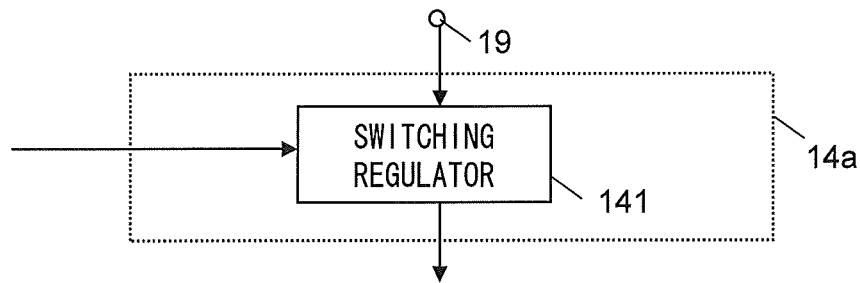
FIG. 2A is a block diagram showing a configuration of a regulator 14a constructed with a switching regulator.

FIG. 1 is a block diagram showing an example of a configuration of a transmitter 1 according to a first embodiment of the present invention. In FIG. 1, the transmitter 1 includes a signal generation section 11, a delay adjustment section 12, a phase modulator 13, a regulator 14, an amplitude modulator 15, a multiplier 16, a power measurement section 17, a control section 18, and a power supply terminal 19.

In the transmitter 1, a baseband signal is inputted as an input signal to the signal generation section 11. The signal generation section 11 performs a predetermined signal processing on the baseband signal and outputs a generated amplitude information as an amplitude signal and outputs the generated phase information as a phase signal. Alternatively, the signal generation section 11 outputs a predetermined AM test signal as the amplitude signal and outputs a predetermined PM test signal as the phase signal. The delay adjustment section 12 adjusts at least one of a delay time of the amplitude signal and a delay time of the phase signal. The phase modulator 13 phase-modulates the phase signal to a phase modulated signal and outputs the phase modulated signal.

Figure 2B:
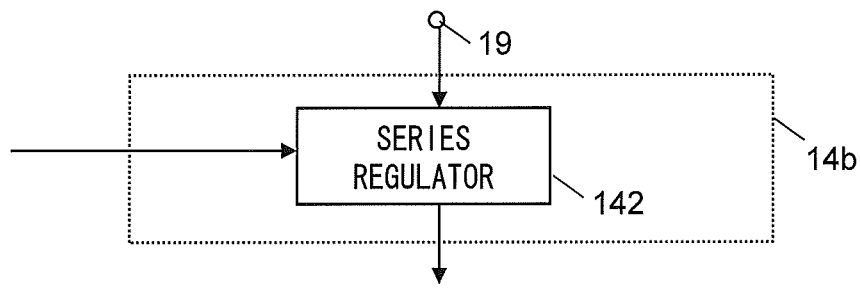
FIG. 2B is a block diagram showing a configuration of a regulator 14b that includes a series regulator.
Figure 2C:
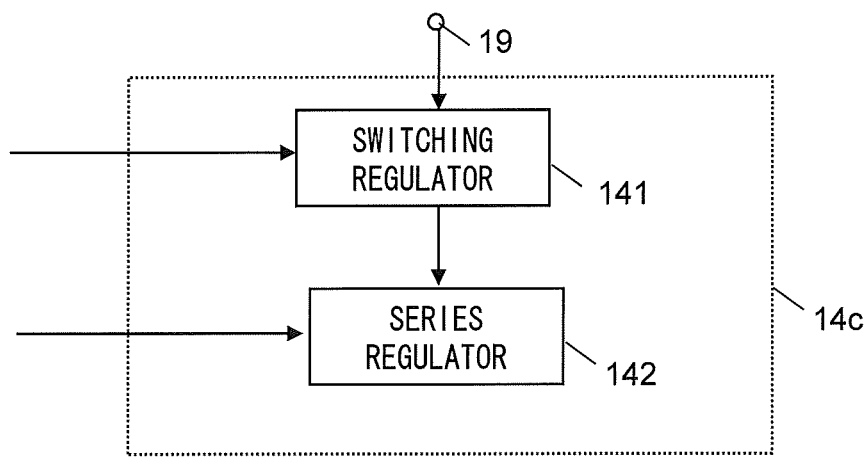
FIG. 2C is a block diagram showing a configuration of a regulator 14c that includes a switching regulator and a series regulator.

The regulator 14 supplies the amplitude modulator 15 and the multiplier 16 with a voltage in accordance with the amplitude signal. Typically, the regulator 14 supplies the amplitude modulator 15 and the multiplier 16 with a voltage which is proportional to a magnitude of the amplitude signal. For example, the regulator 14 may, in the same manner as a regulator 14a shown in FIG. 2A, include a switching regulator 141. Alternatively, the regulator 14 may, in the same manner as a regulator 14b shown in FIG. 2B, include a series regulator 142. Still alternatively, the regulator 14 can, in the same manner as a regulator 14c shown in FIG. 2C, include the switching regulator 141 and the series regulator 142 in combination. In the regulator 14c, the switching regulator 141 transforms a direct current voltage which is supplied from the power supply terminal 19 to a desired voltage and supplies the transformed voltage to the series regulator 142. By amplifying the amplitude signal which is inputted via the delay adjustment section 12 by the voltage supplied from the switching regulator 141, the series regulator 142 supplies the amplitude modulator 15 and the multiplier 16 with the voltage in accordance with the amplitude signal. Further, the regulator 14 may include a current drive type regulator.

The amplitude modulator 15 amplitude-modulates the phase modulated signal to a modulated signal by the voltage supplied from the regulator 14 and outputs the modulated signal which has been phase-modulated and amplitude-modulated. The modulated signal is outputted from the transmitter 1 as a transmission signal. Here, a difference between a time period from when the amplitude signal is outputted from the signal generation section 11 to when the amplitude signal reaches the multiplier 16 and a time period from when the phase signal is outputted from the signal generation section 11 to when the phase signal reaches the multiplier 16 is referred to as a delay error. The multiplier 16 multiplies the phase signal inputted via the delay adjustment section 12 by the output signal of the regulator 14 and outputs a multiplication signal to the power measurement section 17. The power measurement section 17 measures an inputted power of the multiplication signal and outputs the measured value to the control section 18. The control section 18 estimates a delay error on the basis of the inputted measured value, calculates at least one of an amplitude delay time and a phase delay time and sets the calculated delay time so as to cancel the estimated delay error. The delay adjustment section 12 adjusts at least one of the delay time of the amplitude signal and the delay time of the phase signal on the basis of the set amplitude delay time and/or the phase delay time.

In the following, operations of the transmitter 1 according to the first embodiment will be described. The transmitter 1 is provided with two modes which are a normal transmission mode and a test mode. It is a premise that the control section 18 switches between the normal transmission mode and the test mode; however, another component other than the control section 18 may switch between the modes. A timing for switching from the normal transmission mode to the test mode may be, for example, a time when the transmitter 1 is powered on or a time when the output of the transmission signal is interrupted. Alternatively, the normal transmission mode may be switched to the test mode at predetermined intervals.

First, operations in the normal transmission mode will be described. In the normal transmission mode, the signal generation section 11 generates, on the basis of an input signal, amplitude information and phase information and outputs the generated information as an amplitude signal and a phase signal, respectively. The amplitude signal is delayed for the amplitude delay time which is set to adjust the amplitude signal in the delay adjustment section 12 and then inputted to the regulator 14. The regulator 14 outputs a voltage in accordance with the inputted amplitude signal to the amplitude modulator 15 and the multiplier 16.

Meanwhile, the phase signal is delayed for the phase delay time which is set to adjust the phase signal in the delay adjustment section 12 and then outputted to the phase modulator 13 and the multiplier 16. The phase modulator 13 supplies the amplitude modulator 15 with the phase modulated signal obtained by phase modulating the inputted phase signal. By amplifying the phase modulated signal outputted from the phase modulator 13 in accordance with the signal outputted from the regulator 14, the amplitude modulator 15 amplitude-modulates the phase modulated signal to a modulated signal and outputs the modulated signal which has been phase-modulated and amplitude-modulated.

The multiplier 16 multiplies the phase signal inputted via the delay adjustment section 12 by the output signal of the regulator 14 and outputs a multiplication signal to the power measurement section 17. The power measurement section 17 measures an inputted power of the multiplication signal and inputs the measured value to the control section 18. The control section 18 detects a delay error between the delay time of the amplitude signal and the delay time of the phase signal on the basis of the inputted measured value, and calculates at least one of the amplitude delay time and the phase delay time, and sets the calculated delay time in the delay adjustment section 12 so as to cancel the delay error.

In the normal transmission mode, the amplitude delay time and the phase delay time which are set in the delay adjustment section 12 are maintained constant. Accordingly, the multiplier 16, the power measurement section 17 and the control section 18 do not cause any effect on the operations of the normal transmission mode. Consequently, in the normal transmission mode, any of or all of the multiplier 16, the power measurement section 17, and the control section 18 may be stopped from operating.

Next, operations in the test mode will be described. In the test mode, the signal generation section 11 outputs the predetermined AM test signal as the amplitude signal and outputs the predetermined PM test signal as the phase signal. The amplitude signal (AM test signal) is delayed for the amplitude delay time which is set to adjust the amplitude signal in the delay adjustment section 12 and then supplied to the regulator 14. The regulator 14 supplies the amplitude modulator 15 and the multiplier 16 with a voltage in accordance with the amplitude signal.

Meanwhile, the phase signal (PM test signal) is delayed for the phase delay time which is set to adjust the phase signal in the delay adjustment section 12 and then supplied to the phase modulator 13 and the multiplier 16. The phase modulator 13 outputs and supplies the phase modulated signal obtained by phase-modulating the phase signal to the amplitude modulator 15. The multiplier 16 multiplies the phase signal inputted via the delay adjustment section 12 by the output signal of the regulator 14 and outputs a multiplication signal to the power measurement section 17. The power measurement section 17 measures an inputted power of the inputted multiplication signal and outputs the measured value to the control section 18. The control section 18 detects a delay error between the delay time of the amplitude signal and the delay time of the phase signal on the basis of the inputted measured value, and calculates at least one of the amplitude delay time and the phase delay time and sets the calculated delay time to the delay adjustment section 12 so as to cancel the delay error. The delay adjustment section 12 updates at least one of the amplitude delay time and the phase delay time.

The control section 18 can, on the basis of the delay error estimated using the AM test signal and the PM test signal, by using the following method, for example, estimates which one of the AM test signal and the PM test signal is delayed (or advanced). For example, the control section 18 sets, as the amplitude delay time for delaying the amplitude signal, the estimated delay error in the delay adjustment section 12. Then, if the delay error is reduced when the delay error is estimated again, the control section 18 determines that the PM test signal is delayed longer than the AM test signal. In contrast, if the delay error is increased, the control section 18 determines that the AM test signal is delayed longer than the PM test signal. If the delay error is increased, in contrast to the previous case, the control section 18 sets, as the phase delay time for delaying the phase signal, the estimated delay error in the delay adjustment section 12.

It should be noted that, in the test mode, the amplitude modulator 15 is stopped from operating and thus there is no output from the amplitude modulator 15. In order to stop the amplitude modulator 15 from operating, for example, there is a method in which a bias voltage of the amplitude modulator 15 is set to zero.

The transmitter 1 may further include, in the same manner as a transmitter 1b shown in FIG. 1B, a switch 21 at a signal branch point on a path from the delay adjustment section 12 to the phase modulator 13 and a switch 22 at a signal branch point on a path from the regulator 14 to the amplitude modulator 15. With reference to FIG. 1B, the switch 21 is selected so as to connect the delay adjustment section 12 to the phase modulator 13 in the normal transmission mode and connect the delay adjustment section 12 to the multiplier 16 in the test mode. Further, the switch 22 is selected so as to connect the regulator 14 to the amplitude modulator 15 in the normal transmission mode and connects the regulator 14 to the multiplier 16 in the test mode.

When the switches 21, 22 are added to the transmitter 1b, neither the control performed in the normal transmission mode for maintaining the amplitude delay time and the phase delay time of the delay adjustment section 12 constant nor the control performed in the test mode for stopping the amplitude modulator 15 has to be performed. It should be noted that it is a premise that the control section 18 switches between the switch 21 and the switch 22; however, another component other than the control section 18 may switch between the switch 21 and the switch 22.

Here, as an example, the predetermined AM test signal has a duty ratio of 50%, a maximum voltage A[V], a minimum voltage 0[V], a rectangular wave with a cycle T, while the predetermined PM test signal has a duty ratio of 50%, a maximum voltage B[V], a minimum voltage 0[V], and a rectangular wave with a cycle T. The AM test signal and the PM test signal are transmitted continuously during a predetermined time period.

Figure 3:
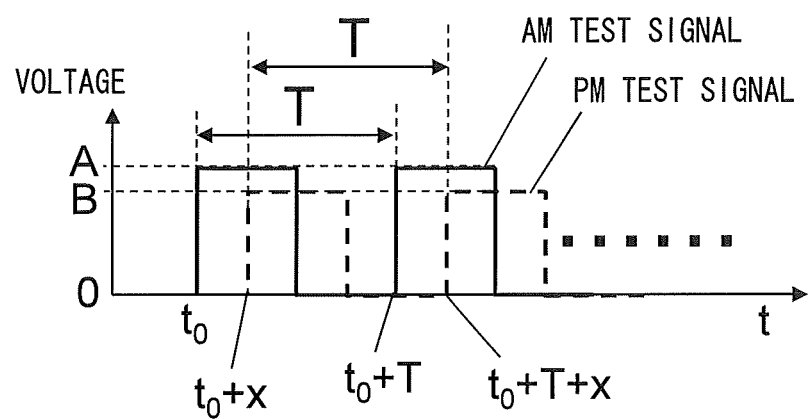
FIG. 3 shows examples of time waveforms of an AM test signal and a PM test signal.

In the following, a method for estimating a delay error when the AM test signal and the PM test signal are used will be described. In the multiplier 16, when a delay time of the phase signal is x longer than a delay time of the amplitude signal, waveforms of the AM test signal and the PM test signal at the input of the multiplier 16 are as shown in FIG. 3 if a time when the AM test signal reaches the multiplier 16 is $t_0$.

When the AM test signal at the input of the multiplier 16 is $f_A(t)$, the PM test signal at the input of the multiplier 16 is $f_P(t)$, the multiplication signal outputted from the multiplier 16 is g(t), $f_A(t)$, $f_P(t)$, and g(t) are calculated, respectively as follows. Accordingly, the AM test signal $f_A(t)$, the PM test signal $f_P(t)$, and the multiplication signal g(t) can be represented by respective periodic functions. Here, n is any natural number including 0.

$$f_A(t) = \begin{cases} A & \left(t_0 + nT \leq t < t_0 + \frac{2n+1}{2}T\right) \\ 0 & \left(t_0 + \frac{2n+1}{2}T \leq t < t_0 + (n+1)T\right) \end{cases} \quad \text{[Formula 1]}$$

$$f_P(t) = \begin{cases} B & \left(t_0 + nT + x \leq t < t_0 + \frac{2n+1}{2}T + x\right) \\ 0 & \left(t_0 + \frac{2n+1}{2}T + x \leq t < t_0 + (n+1)T + x\right) \end{cases}$$

$$g(t) = f_A(t) \cdot f_P(t) \quad \text{[Formula 2]}$$

when $x \geq 0$ $$g(t) = \begin{cases} AB & \left(t_0 + nT + x \leq t < t_0 + \frac{2n+1}{2}T\right) \\ 0 & \left(t_0 + \frac{2n+1}{2}T \leq t < t_0 + (n+1)T + x\right) \end{cases}$$

when $x < 0$ $$g(t) \begin{cases} AB & \left(t_0 + nT \leq t < t_0 + \frac{2n+1}{2}T + x\right) \\ 0 & \left(t_0 + \frac{2n+1}{2}T + x \leq t < t_0 + (n+1)T\right) \end{cases}$$

In this case, an average power P of the multiplication signal is calculated as follows.

$$P = \frac{\int_{t_0}^{t_0+T} g(t)\,dt}{T} \quad \text{[Formula 3]}$$

$$= \begin{cases} \frac{AB}{2T}(T - 2x) & (x \geq 0) \\ \frac{AB}{2T}(T + 2x) & (x < 0) \end{cases}$$

Figure 4:
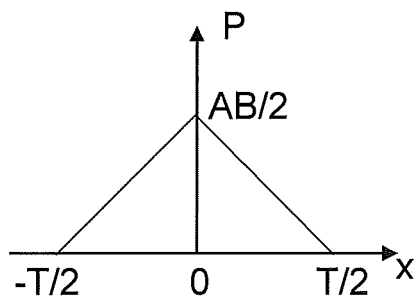
FIG. 4 is a block diagram showing an example of a relationship between a delay error and an average power of a signal obtained by multiplying the AM test signal by the PM test signal.

The relationship between the delay error x between the delay time of the AM test signal and the delay time of the PM test signal, and the average power P of the multiplication signal g(t) is shown in FIG. 4. With reference to FIG. 4, the average power P becomes a maximum value when there is no delay error between the delay time of the AM test signal and the delay time of the PM test signal, and the average power P shows a convex shape with the maximum value at the peak thereof with respect to a delay error within a time range of ±T/2.

Accordingly, when the shape shown by the average power P of the multiplication signal g(t) has the above characteristics, the control section 18 estimates, if the delay error is within the time range of ±T/2, the delay error on the basis of the measured value measured by the power measurement section 17. Further, by setting, in the delay adjustment section 12, at least one of the amplitude delay time and the phase delay time based on the estimated delay error, the control section 18 can compensate the delay error.

It should be noted that the AM test signal and the PM test signal may be outputted from the signal generation section 11 continuously during a predetermined time period or may be outputted during only one cycle.

The AM test signal and the PM test signal each may be any kind of signal if the average power P of the multiplication signal becomes a maximum value when there is no delay error between the AM test signal and the PM test signal and shows a convex shape with the maximum value at the peak thereof with respect to the delay error within the predetermined time range.

Figure 5A:
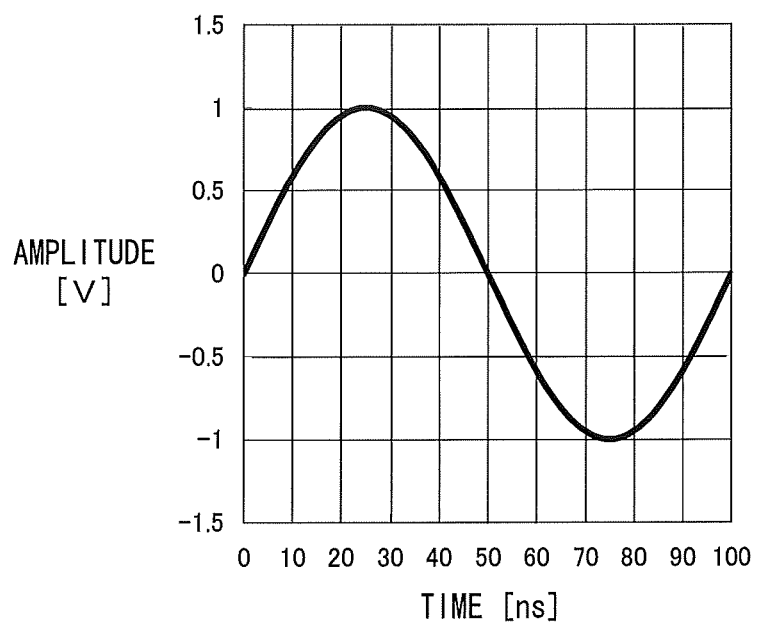
FIG. 5A shows a sine wave used to examine an effect of the present invention.
Figure 5B:
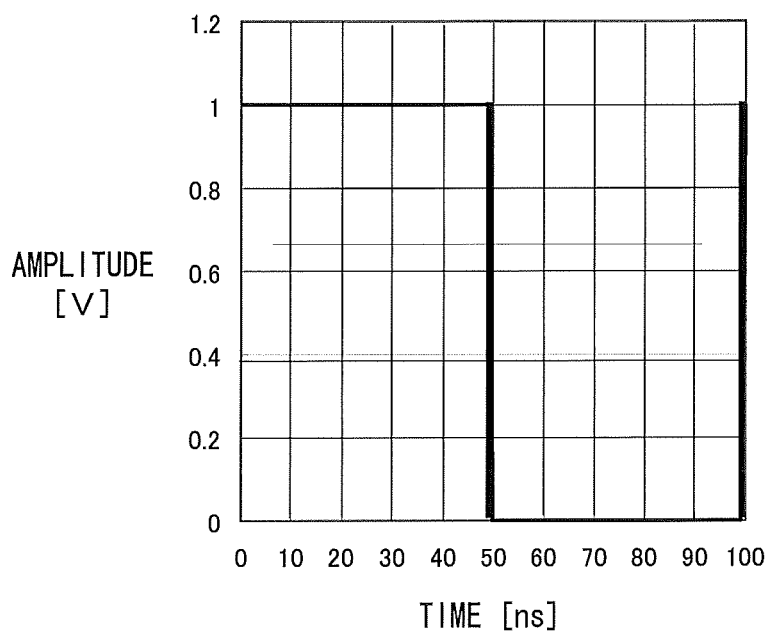
FIG. 5B shows a rectangular wave used to examine the effect of the present invention.
Figure 5C:
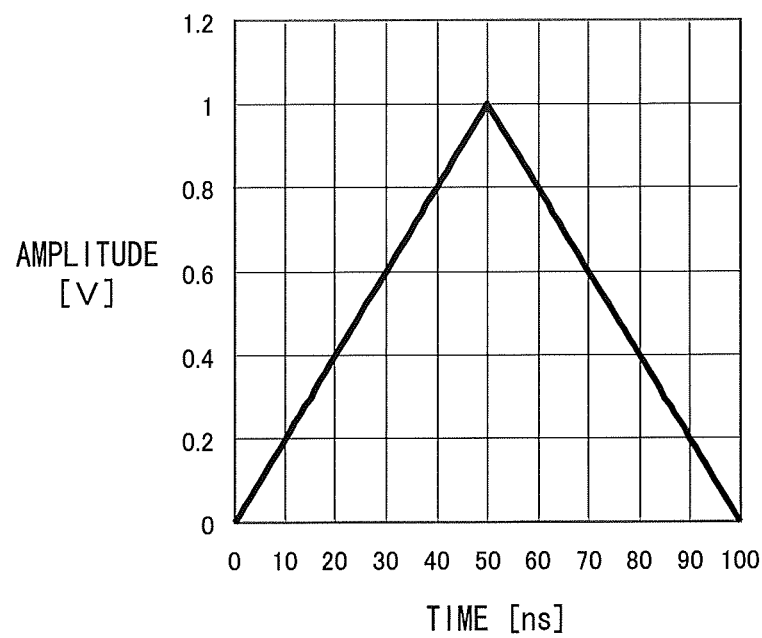
FIG. 5C shows a triangular wave used to examine the effect of the present invention.
Figure 5D:
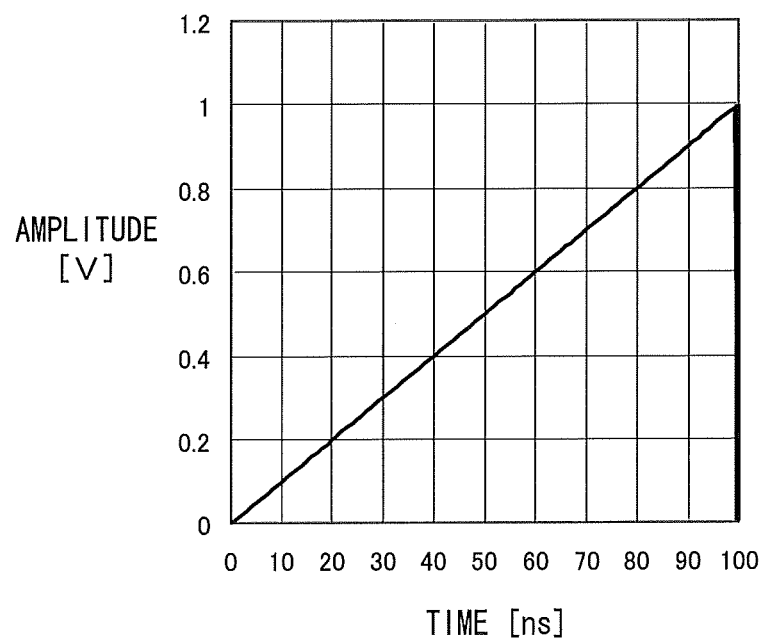
FIG. 5D shows a saw-tooth wave used to examine the effect of the present invention.
Figure 5E:
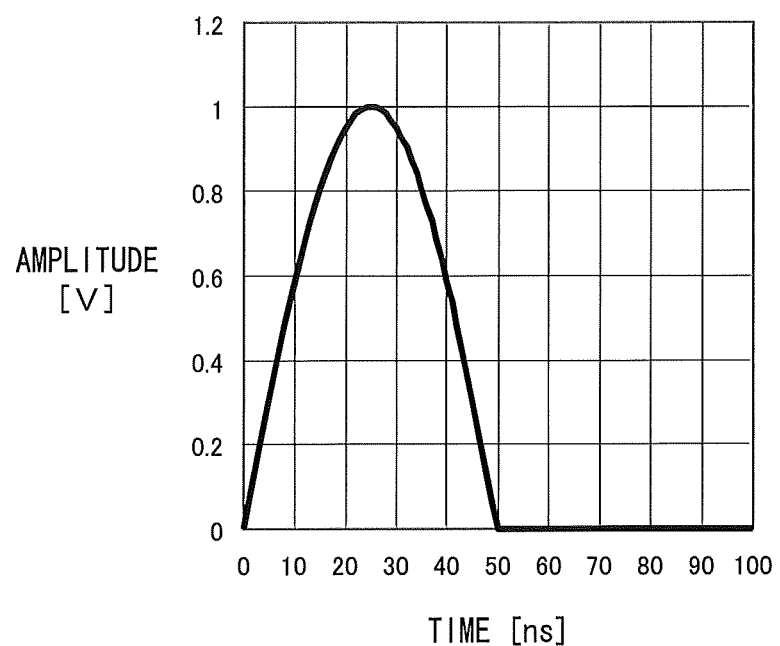
FIG. 5E shows a half wave used to examine the effect of the present invention.

A table of FIG. 6 shows whether a definition that "the average power P of the multiplication signal becomes a maximum value when there is no delay error between the AM test signal and the PM test signal and the average power P shows a convex shape with the maximum value at the peak thereof with respect to the delay error within the predetermined time range" is fulfilled, when the AM test signal and the PM test signal is any of a sine wave shown in FIG. 5A, a rectangular wave shown in FIG. 5B, a triangular wave shown in FIG. 5C, a saw-tooth wave shown in FIG. 5D, and a half wave shown in FIG. 5E.

In FIG. 6, "○" indicates that the above definition is fulfilled while "x" indicates that the above definition is not fulfilled. In FIG. 6, each type of the AM test signal is combined with a different type of the PM test signal, and each combination of the AM test signal and the PM test signal is combined with a different cycle. For example, a description of "2*AM cycle=PM cycle" indicates that the cycle of the PM test signal is the double of the cycle of the AM test signal. Further, FIG. 6 shows both characteristics when the AM test signal and the PM test signal are continuously transmitted and when the AM test signal and the PM test signal are transmitted during only one cycle. In FIG. 6, if a combination of the AM test signal and the PM test signal with a "○" mark is selected, an advantageous effect of the present invention can be achieved.

However, even with a signal not exemplified in FIG. 6, the advantageous effect of the present invention can be achieved if the AM test signal and the PM test signal that fulfill the definition that "the average power of the multiplication signal becomes the maximum value when there is no delay error between the AM test signal and the PM test signal and the average power of the multiplication signal shows a convex shape with the maximum value at the peak thereof with respect to the delay error within a predetermined time range."

It should be noted that, in FIG. 6, even among the combinations with the "○" marks, an adjustment accuracy of the delay time in the present invention varies depending on which combination to select. FIG. 7 shows an example of average power characteristics, with respect to the delay error, of the multiplication signal which is obtained by multiplying the AM test signal by the PM test signal. In FIG. 7, when a combination of waveforms of the AM test signal and the PM test signal is indicated as (AM test signal, PM test signal), the average power characteristics of the multiplication signal with respect to the delay error in respective cases of (rectangular wave, rectangular wave), (triangular wave, triangular wave), (triangular wave, sine wave), and (rectangular wave, sine wave) are shown. It should be noted that, in FIG. 7, it is assumed that both of the cycle T of the AM test signal and the cycle T of the PM test signal are 100 nsec and that both of the AM test signal and of the PM test signal are continuously transmitted.

First, in the case of the combination of (rectangular wave, sine wave) having a "x" mark as shown in FIG. 6, the average power of the multiplication signal does not change with respect to the delay error and thus the advantageous effect of the present invention cannot be achieved.

Next, when the combinations of (rectangular wave, rectangular wave), (triangular wave, triangular wave), and (triangular wave, sine wave) are compared with one another, in the case of (rectangular wave, rectangular wave), the average power most rapidly changes with respect to the delay error while the average power most gradually changes with respect to the delay error in the case of (triangular wave, sine wave). When a measurement error in the power measurement section 17 is considered, an influence exerted by the measurement error on the estimation precision of the delay error becomes the least when the average power rapidly changes with respect to the delay time. Accordingly, in the example of FIG. 7, the combination of (rectangular wave, rectangular wave) can achieve the highest adjustment accuracy of the delay error in the present invention.

Further, when an adjustable range of the delay error is considered, the adjustable range is ±50 nsec that corresponds to ±T/2 in the cases of (rectangular wave, rectangular wave) and (triangular wave, triangular wave), while the adjustable range is only ±25 nsec that corresponds to ±T/4 in the case of (triangular wave, sine wave). Here, the adjustable range of the delay error equals the range with respect to which the average power of the multiplication signal shows the convex shape with the maximum value at the peak thereof. In the present invention, in order to adjust the delay error highly accurately, the adjustable range of the delay error needs to be greater than the maximum variable range of the delay error which changes depending on individual differences of an analog device and an analog element of the transmitter 1, temperature fluctuations, supply voltage fluctuations (that is, characteristics variation of the transmitter 1).

As described above, the transmitter 1 according to the first embodiment of the present invention can operate with higher efficiency than the conventional transmitter which generates a transmission signal by using a modulation method such as the quadrature modulation, and the like. Further, by compensating a difference between the delay time of the amplitude signal and the delay time of the phase signal, the transmitter 1 can improve distortion characteristics of the transmission signal. Still further, en element such as a coupler or the like which is required in the conventional method is not required, thereby realizing a circuit scale which is small in size. Yet further, delay compensation with higher accuracy than the conventional delay compensation using the phase difference detection of the radio frequency signal can be realized.

(Second Embodiment)

Figure 8A:
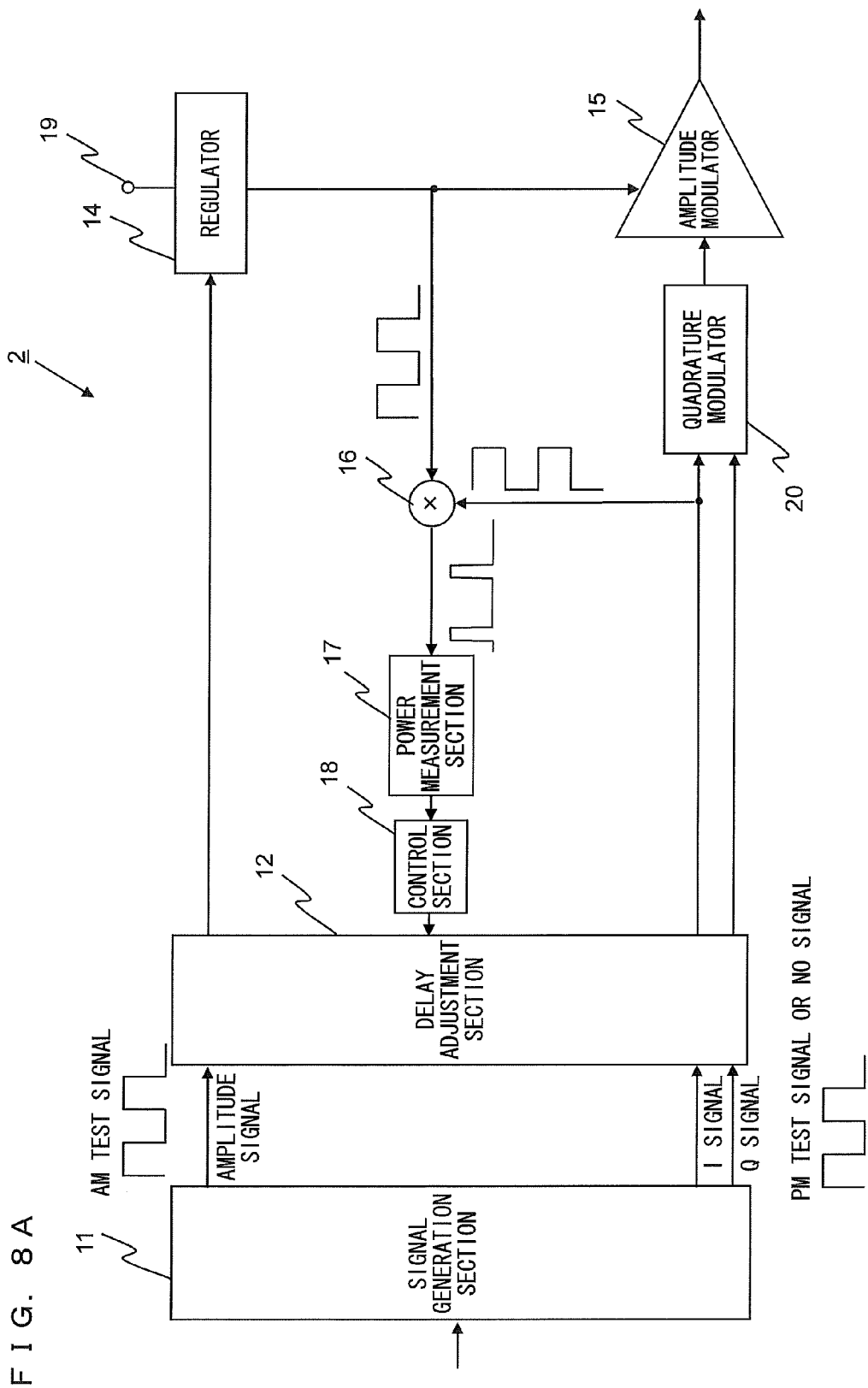
FIG. 8A is a block diagram showing an example of a configuration of a transmitter 2 according to a second embodiment of the present invention.

FIG. 8A is a block diagram showing an example of a configuration of a transmitter 2 according to a second embodiment of the present invention. In FIG. 8A, the transmitter 2 includes the signal generation section 11, the delay adjustment section 12, the regulator 14, the amplitude modulator 15, the multiplier 16, the power measurement section 17, the control section 18, the power supply terminal 19, and a quadrature modulator 20.

The transmitter 2 according to the second embodiment is different from the transmitter 1 according to the first embodiment in that the quadrature modulator 20 is included instead of the phase modulator 13. Specifically, in the transmitter 1 described in the first embodiment, the phase modulated signal is generated by the phase modulator 13. On the other hand, in the transmitter 2, the phase modulated signal is generated by the quadrature modulator 20.

In the transmitter 2, the baseband signal is inputted as an input signal to the signal generation section 11. The signal generation section 11 outputs the amplitude information, an in-phase component of the phase information, and a quadrature component of the phase information which have been generated by performing a predetermined signal processing on the baseband signal as the amplitude signal, an I (In-phase) signal, and a Q (quadrature-phase) signal, respectively. Alternatively, the signal generation section 11 outputs the predetermined AM test signal as the amplitude signal and outputs the predetermined PM test signal as the I signal without outputting any signal as the Q signal.

Specifically, in the normal transmission mode, the signal generation section 11 outputs the amplitude information, the in-phase component of the phase information and the quadrature component of the phase information, which have been generated by performing the predetermined signal processing on the baseband signal, as the amplitude signal, the I signal, and the Q signal, respectively. On the other hand, in the test mode, the signal generation section 11 outputs the predetermined AM test signal as the amplitude signal and outputs the predetermined PM test signal as the I signal without outputting any signal as the Q signal.

The I signal is delayed for an I signal delay time which is set to adjust the I signal in the delay adjustment section 12 and then supplied to the quadrature modulator 20 and the multiplier 16. The Q signal is delayed for a Q signal delay time which is set to adjust the Q signal in the delay adjustment section 12 and then supplied to the quadrature modulator 20. The quadrature modulator 20 generates a phase modulated signal by quadrature-modulating each of the I signal and the Q signal and outputs the phase modulated signal to the amplitude modulator 15. As in the same manner as in the transmitter 1, the amplitude signal is outputted to the amplitude modulator 15 and the multiplier 16 via the delay adjustment section 12 and the regulator 14.

In the normal transmission mode, by amplifying the phase modulated signal outputted from the quadrature modulator 20 in accordance with the output signal of the regulator 14, the amplitude modulator 15 amplitude-modulates the phase modulated signal to a modulated signal and then outputs the modulated signal which has been phase-modulated and amplitude-modulated. In the same manner as the first embodiment, in the transmitter 2, the amplitude modulator 15 is stopped from operating in the test mode and thus there is no output from the amplitude modulator 15.

In the test mode, the multiplier 16, the power measurement section 17, and the control section 18 operate in the same manner as in the first embodiment, and a delay error is adjusted in the same manner as in the first embodiment. However, the control section 18 calculates at least one of the amplitude delay time and the I signal delay time (or the Q signal delay time) and sets the calculated delay time in the delay adjustment section 12. Further, in the normal transmission mode, in the same manner as in the first embodiment, the amplitude delay time and the I signal delay time (or the Q signal delay time) which are set in the delay adjustment section 12 are maintained constant. It should be noted that the I signal delay time and the Q signal delay time are basically set to the same value. Thus, the I signal delay time and the Q signal delay time may be collectively referred to as an IQ signal delay time.

Further, although a case has been described in which the I signal is supplied via the delay adjustment section 12 to the quadrature modulator 20 and the multiplier 16 and the Q signal is supplied via the delay adjustment section 12 to the quadrature modulator 20, the effect of the present invention can be achieved by a configuration in which the Q signal is supplied via the delay adjustment section 12 to the quadrature modulator 20 and the multiplier 16 and the I signal is supplied via the delay adjustment section 12 to the quadrature modulator 20. However, in this case, in the normal transmission mode, the signal generation section 11 outputs the amplitude information, the quadrature component of the phase information, and the in-phase component of the phase information which have been generated by performing the predetermined signal processing on the baseband signal, as the amplitude signal, the I signal, and the Q signal, respectively. Further, in the test mode, the signal generation section 11 outputs the predetermined AM test signal as the amplitude signal and outputs the predetermined PM test signal as the Q signal without outputting any signal as the I signal.

Figure 8B:
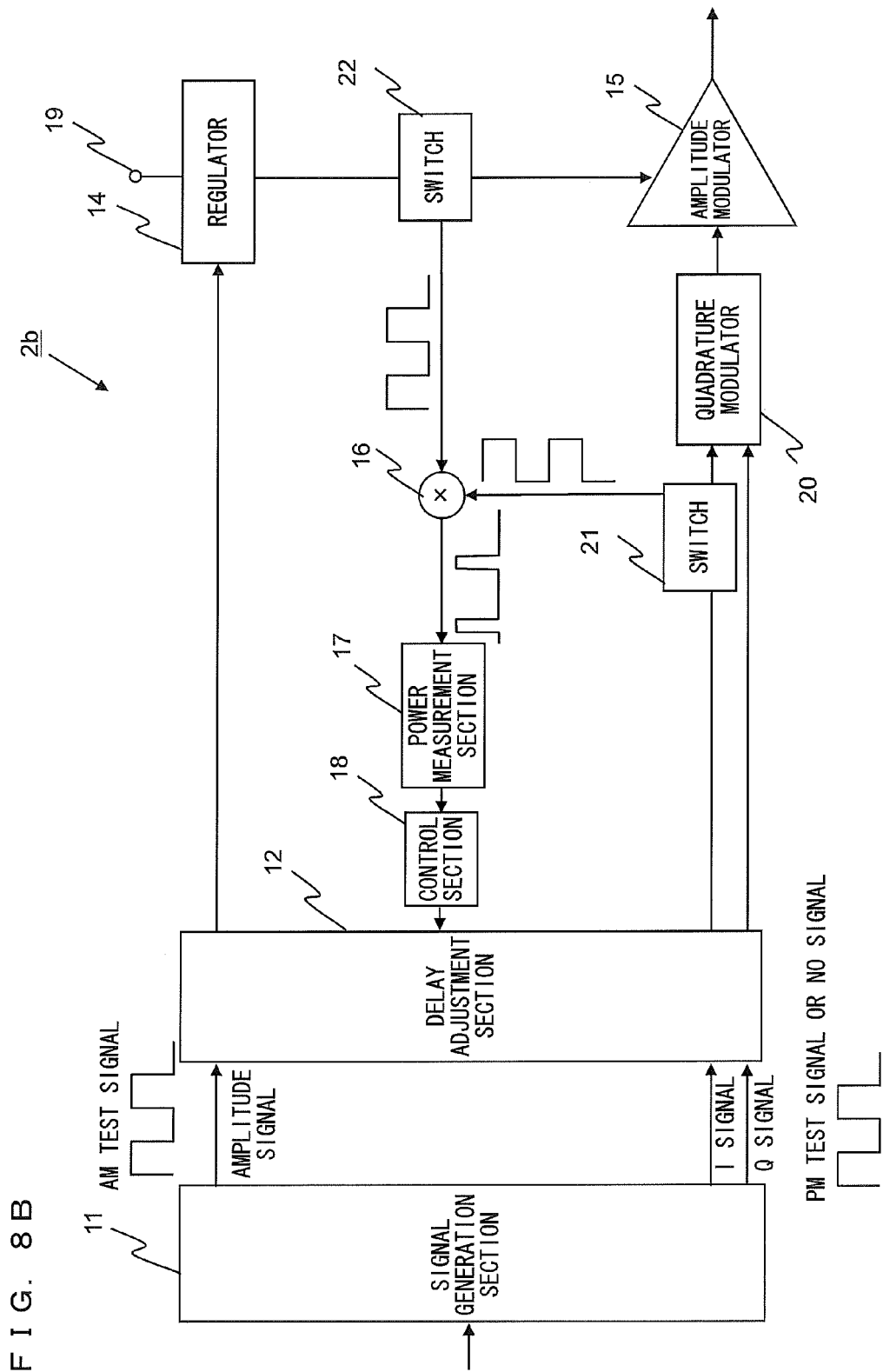
FIG. 8B is a block diagram showing an example of a configuration of a transmitter 2b according to the second embodiment of the present invention.

The transmitter 2 may further include, in the same manner as in the first embodiment, the switch 21 at the signal branch point on the path from the delay adjustment section 12 to the quadrature modulator 20 and the switch 22 at the signal branch point on the path from the regulator 14 to the amplitude modulator 15. With reference to FIG. 8B, the switch 21 is selected so as to connect the delay adjustment section 12 to the quadrature modulator 20 in the normal transmission mode and connect the delay adjustment section 12 to the multiplier 16 in the test mode. Further, the switch 22 is selected so as to connect the regulator 14 to the amplitude modulator 15 in the normal transmission mode and connect the regulator 14 to the multiplier 16 in the test mode.

As described above, the transmitter 2 according to the second embodiment of the present invention can compensate a delay error as in the same manner as the first embodiment, if the AM test signal and the PM test signal are selected such that the average power of the multiplication signal obtained by multiplying the AM test signal by the PM test signal becomes the maximum value when there is no delay error between the AM test signal and the PM test signal, and the average power of the multiplication signal shows a convex shape with the maximum value at the peak thereof with respect to the delay error within the predetermined time range.

(Third Embodiment)

Figure 9B:
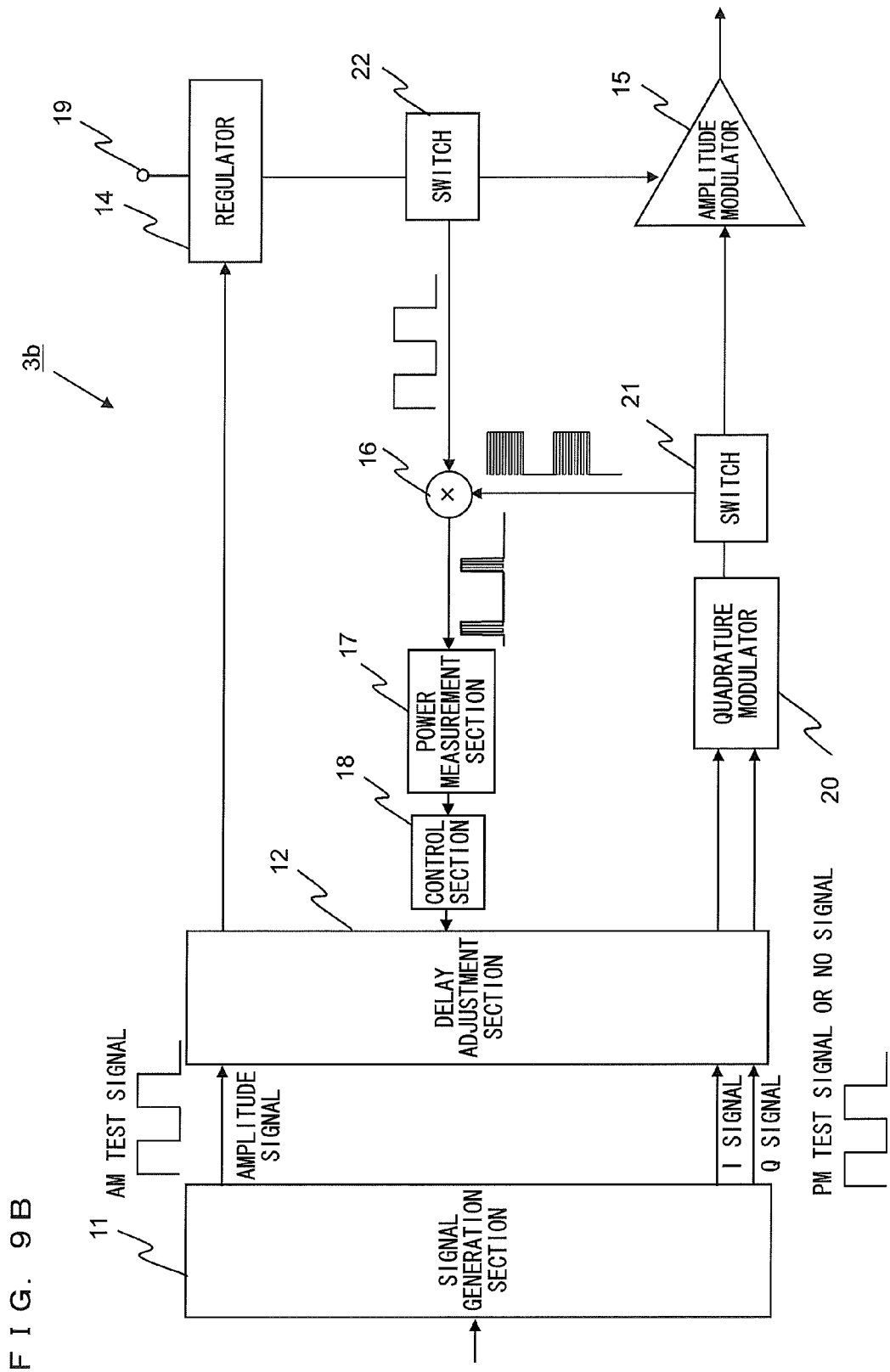
FIG. 9B is a block diagram showing an example of a configuration of a transmitter 3b according to the third embodiment of the present invention.
Figure 11:
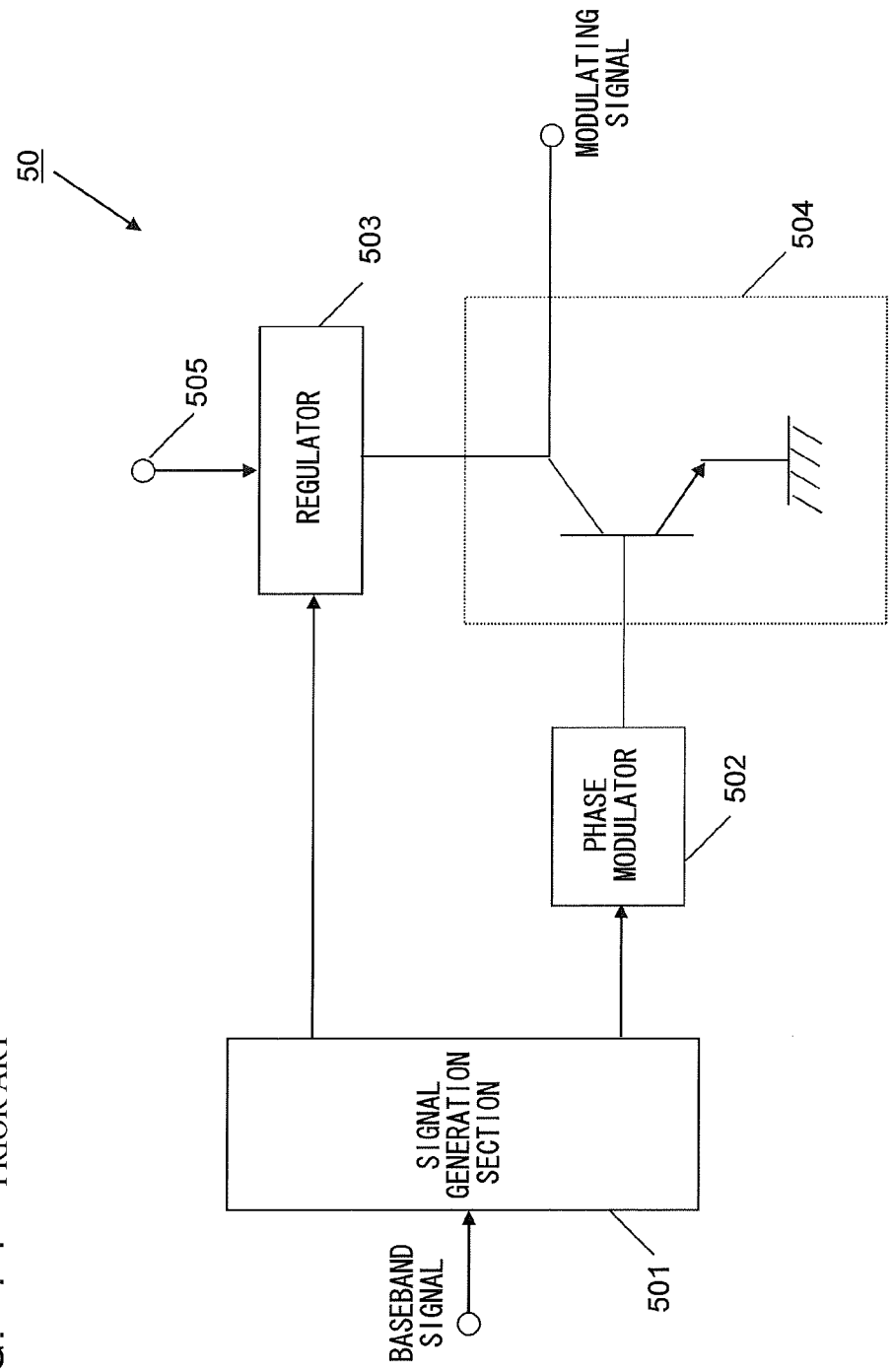
FIG. 11 is a block diagram showing an example of a configuration of a conventional transmitter 50.
Figure 12:
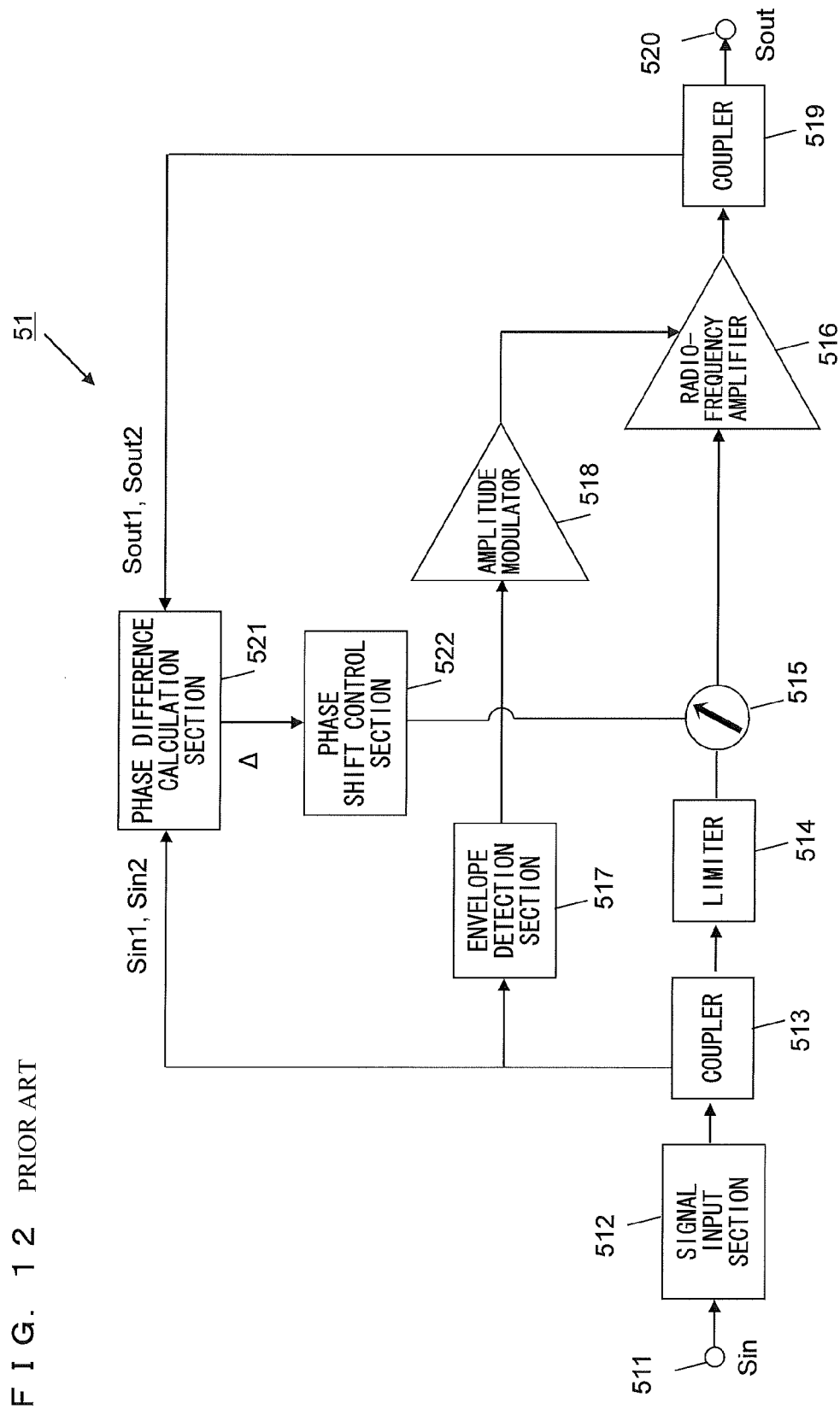
FIG. 12 is a block diagram showing an example of a configuration of a conventional transmitter 51 which performs a delay error adjustment.

FIG. 9A is a block diagram showing an example of a configuration of a transmitter 3 according to a third embodiment of the present invention. In FIG. 9A, the transmitter 3 includes the signal generation section 11, the delay adjustment section 12, the regulator 14, the amplitude modulator 15, the multiplier 16, the power measurement section 17, the control section 18, the power supply terminal 19, and the quadrature modulator 20.

The transmitter 3 according to the third embodiment is different from the transmitter 2 according to the second embodiment in that the signal inputted to the multiplier 16 is different. Specifically, in the transmitter 2 shown in the second embodiment, the I signal is supplied to the delay adjustment section 12 via the multiplier 16. On the other hand, in the transmitter 3, the phase modulated signal outputted from the quadrature modulator 20 is supplied to the multiplier 16.

In the transmitter 3, the operations performed in the normal transmission mode are the same as those performed in the transmitter 2, and thus descriptions thereof are omitted.

In the test mode, the signal generation section 11 outputs the predetermined AM test signal as the amplitude signal and outputs the predetermined PM test signal as the I signal. In this case, the signal generation section 11 does not output any signal as the Q signal. It should be noted that the effect to be achieved is the same even if the signal generation section 11 outputs the predetermined PM test signal as the Q signal and outputs no signal as the I signal.

In the test mode, the transmitter 3 is different from the transmitter 2 in that the phase modulated signal is supplied to the multiplier 16; however, the multiplier 16, the power measurement section 17, and the control section 18 operate in the same manner as in the transmitter 2 and a delay error is adjusted in the same manner as in the transmitter 2. It should be noted that, in the transmitter 3, in the same manner as in the transmitter 1 and the transmitter 2, the amplitude delay time and the I signal delay time (or the Q signal delay time) of the delay adjustment section 12 are maintained constant in the normal transmission mode.

Further, the transmitter 3 may further include, in the same manner as in the first embodiment, the switch 21 at a signal branch point on a path from the quadrature modulator 20 and the amplitude modulator 15 and the switch 22 at the signal branch point on the path from the regulator 14 to the amplitude modulator 15. In a transmitter 3b shown in FIG. 9B, the switch 21 is selected so as to connect the quadrature modulator 20 to the amplitude modulator 15 in the normal transmission mode and connect the quadrature modulator 20 to the multiplier 16 in the test mode. Further, the switch 22 is selected so as to connect the regulator 14 to the amplitude modulator 15 in the normal transmission mode and connect the regulator 14 to the multiplier 16 in the test mode.

As described above, the transmitter 3 according to the third embodiment of the present invention can compensate a delay error in the same manner as the first and the second embodiments, if the AM test signal and the PM test signal are selected such that the average power of the multiplication signal obtained by multiplying the AM test signal by the PM test signal becomes a maximum value when there is no delay error between the AM test signal and the PM test signal, and the average power of the multiplication signal shows a convex shape with the maximum value at the peak thereof with respect to the delay error within a predetermined time range.

(Fourth Embodiment)

FIG. 10 is a block diagram showing an example of a configuration of a communication apparatus 30 according to a fourth embodiment of the present invention. With reference to FIG. 10, the communication apparatus 30 according to the fourth embodiment includes a transmitter 31, a reception circuit 32, an antenna duplexer 33, and an antenna 34. As the transmitter 31, any one of the transmitters according to the first to the third embodiments is used. The transmitter 31 amplifies an input signal to obtain a transmission signal. The antenna duplexer 33 transfers the transmission signal from the transmitter 31 to the antenna 34 while preventing the transmission signal from leaking into the reception circuit 32. Further, the antenna duplexer 33 transfers the reception signal inputted from the antenna 34 to the reception circuit 32 while preventing the reception signal from leaking into the transmitter 31.

Accordingly, the transmission signal from the transmitter 31 is released from the antenna 34 via the antenna duplexer 33 to an open space. The reception signal is received by the antenna 34 and received by the reception circuit 32 via the antenna duplexer 33. Consequently, the communication apparatus 30 according to the fourth embodiment can, by using the transmitter according to any one of the first to the third embodiments, ensures linearity of a transmission signal and attains a low distortion wireless device. It should be noted that the communication apparatus 30 may include only the transmitter 31 and the antenna 34.

Industrial Applicability

The transmitter according to the present invention is useful as a transmitter for a communication apparatus such as a mobile phone, a wireless LAN, and the like.

Description of the Reference Characters 1,2,3 transmitter
11 signal generation section
12 delay adjustment section
13 phase modulator
14 regulator
141 switching regulator
142 series regulator
15 amplitude modulator
16 multiplier
17 power measurement section
18 control section
19 power supply terminal
20 quadrature modulator
21,22 switch
30 communication apparatus
31 transmitter
32 reception circuit
33 antenna duplexer
34 antenna
50,51 transmitter
501 signal generation section
502 phase modulator
503 regulator
504 power amplifier
505 power supply terminal
511 input terminal
512 signal input section
513 coupler
514 limiter
515 phase shifter
516 radio-frequency amplifier
517 envelope detection section
518 amplitude modulator
519 coupler
520 output terminal
521 phase difference calculation section
522 phase shift control section

The invention claimed is:

1. A transmitter which generates a transmission signal on the basis of an input signal, the transmitter comprising:
a signal generation circuit for outputting an amplitude component of the input signal as an amplitude signal and outputting a phase component of the input signal as a phase signal in a normal transmission mode;
a delay adjustment circuit for, on the basis of at least one of an amplitude delay time which is set to adjust a delay time of the amplitude signal and a phase delay time which is set to adjust a delay time of the phase signal, adjusting at least one of the delay time of the amplitude signal and the delay time of the phase signal;

a phase modulator for phase-modulating the phase signal which is inputted via the delay adjustment circuit to a phase modulated signal and outputting the phase modulated signal;

a regulator for outputting a signal in accordance with a magnitude of the amplitude signal which is inputted via the delay adjustment circuit;

an amplitude modulator for, by amplifying the phase modulated signal outputted from the phase modulator in accordance with the signal outputted from the regulator, amplitude-modulating the phase modulated signal to a modulated signal and outputting the modulated signal which has been phase-modulated and amplitude-modulated;

a multiplier for multiplying the phase signal outputted from the signal generation circuit by the signal outputted from the regulator and outputting a multiplication signal;

a power measurement circuit for measuring a power of the multiplication signal; and a control circuit for calculating at least one of the amplitude delay time and the phase delay time on the basis of a value measured by the power measurement circuit, wherein the signal generation circuit outputs a predetermined AM test signal as the amplitude signal and outputting a predetermined PM test signal as the phase signal in a test mode, the AM test signal and the PM test signal are set such that an average power of the multiplication signal becomes a maximum value when there is no delay error between the AM test signal and the PM test signal, and the average power of the multiplication signal shows a convex shape with the maximum value at the peak thereof with respect to a delay error within a predetermined time range, and the control circuit estimates a delay error between the AM test signal and the PM test signal on the basis of the value measured by the power measurement circuit, calculates at least one of the amplitude delay time and the phase delay time so as to cancel the delay error, and sets the calculated delay time in the delay adjustment circuit.

2. The transmitter according to claim 1, wherein the predetermined time range is greater than a maximum variable range of the delay error which changes depending on characteristics variation of the transmitter.

3. The transmitter according to claim 1, wherein the amplitude modulator is stopped from operating in the test mode.

4. The transmitter according to claim 1, wherein the amplitude delay time and the phase delay time which are set in the delay adjustment circuit are not changed in the normal transmission mode.

5. The transmitter according to claim 1, wherein the AM test signal and the PM test signal are outputted from the signal generation circuit continuously during a predetermined time period.

6. The transmitter according to claim 5, wherein the predetermined time period is within 50 nsec.

7. The transmitter according to claim 1, wherein the AM test signal and the PM test signal are periodic functions.

8. The transmitter according to claim 1, wherein the AM test signal is any one of a sine wave, a rectangular wave, a triangular wave, a saw-tooth wave, and a half sine wave.

9. The transmitter according to claim 1, wherein the PM test signal is any one of a sine wave, a rectangular wave, a triangular wave, a saw-tooth wave, and a half sine wave.

10. The transmitter according to claim 1, further comprising:

a first switch for switching connection of the delay adjustment circuit between the phase modulator and the multiplier ; and a second switch for switching connection of the regulator between the amplitude modulator and the multiplier, wherein the first switch connects the delay adjustment circuit to the phase modulator in the normal transmission mode and connects the delay adjustment circuit to the multiplier in the test mode, and the second switch connects the regulator to the amplitude modulator in the normal transmission mode and connects the regulator to the multiplier in the test mode.

11. A communication apparatus, comprising:

a transmitter for amplifying an input signal to obtain a transmission signal; and an antenna for outputting the transmission signal, wherein the transmitter is the transmitter according to claim 1.

12. The communication apparatus according to claim 11, further comprising:

a reception circuit for processing a reception signal which is received from the antenna; and an antenna duplexer for outputting the transmission signal amplified in the transmitter to the antenna and outputting the reception signal received from the antenna to the reception circuit.

13. A transmitter which generates a transmission signal on the basis of an input signal, the transmitter comprising:

a signal generation circuit for outputting an amplitude component of the input signal as an amplitude signal and outputting a phase component of the input signal as an I signal and a Q signal in a normal transmission mode;

a delay adjustment circuit for, on the basis of at least one of an amplitude delay time which is set to adjust a delay time of the amplitude signal and an IQ signal delay time which is set to adjust a delay time of the I signal and of the Q signal, adjusting at least one of the delay time of the amplitude signal and the delay time of the I signal and of the Q signal;

a quadrature modulator for quadrature-modulating each of the I signal and the Q signal which are inputted via the delay adjustment circuit to phase modulated signal and outputting the phase modulated signal;

a regulator for outputting a signal in accordance with a magnitude of the amplitude signal which is inputted via the delay adjustment circuit;

an amplitude modulator for, by amplifying the phase modulated signal outputted from the quadrature modulator in accordance with the signal outputted from the regulator, amplitude-modulating the phase modulated signal to modulated signal and outputting the modulated signal which has been phase-modulated and amplitude-modulated;

a multiplier, which is connected between the delay adjustment circuit and the quadrature modulator, for multiplying one of the I signal and the Q signal inputted via the delay adjustment circuit by the signal outputted from the regulator, and outputting a multiplication signal;

a power measurement circuit for measuring a power of the multiplication signal; and a control circuit for calculating at least one of the amplitude delay time and the IQ signal delay time on the basis of a value measured by the power measurement circuit, wherein the signal generation circuit outputs a predetermined AM test signal as the amplitude signal and outputs a predetermined PM test signal as one of the I signal and the Q signal, in a test mode, the AM test signal and the PM test signal are set such that an average power of the multiplication signal becomes a maximum value when there is no delay error between the AM test signal and the PM test signal, and the average power of the multiplication signal shows a convex shape with the maximum value at the peak thereof with respect to a delay error within a predetermined time range, and the control circuit estimates a delay error between the AM test signal and the PM test signal on the basis of the value measured by the power measurement circuit, calculates at least one of the amplitude delay time and the IQ signal delay time so as to cancel the delay error, and sets the calculated delay time in the delay adjustment circuit.

14. The transmitter according to claim 13, wherein the multiplier is connected between the quadrature modulator and the amplitude modulator, multiplies the phase modulated signal outputted from the quadrature modulator by the signal outputted from the regulator, and outputs the multiplication signal.

15. The transmitter according to claim 14, further comprising:

a first switch for switching connection of the quadrature modulator between the amplitude modulator and the multiplier; and a second switch for switching connection of the regulator between the amplitude modulator and the multiplier, wherein the first switch connects the quadrature modulator to the amplitude modulator in the normal transmission mode and connects the quadrature modulator to the multiplier in the test mode, and the second switch connects the regulator to the amplitude modulator in the normal transmission mode and connects the regulator to the multiplier in the test mode.

16. The transmitter according to claim 13, wherein the amplitude delay time and the IQ signal delay time which are set in the delay adjustment circuit are not changed in the normal transmission mode.

17. The transmitter according to claim 13, further comprising:

a first switch for switching connection of the delay adjustment circuit between the quadrature modulator and the multiplier; and a second switch for switching connection of the regulator between the amplitude modulator and the multiplier, wherein the first switch connects the delay adjustment circuit to the quadrature modulator in the normal transmission mode and connects the delay adjustment circuit to the multiplier in the test mode, and the second switch connects the regulator to the amplitude modulator in the normal transmission mode and connects the regulator to the multiplier in the test mode.

* * * * *